(12) United States Patent
Hu et al.

(10) Patent No.: US 10,546,842 B2
(45) Date of Patent: Jan. 28, 2020

(54) DISPLAY DEVICE AND METHOD FOR FORMING THE SAME

(71) Applicant: InnoLux Corporation, Miao-Li County (TW)

(72) Inventors: Shun-Yuan Hu, Miao-Li County (TW); Chia-Hsiu Hsu, Miao-Li County (TW); Ming-I Chao, Miao-Li County (TW); Ming-Chang Lin, Miao-Li County (TW); Tzu-Min Yan, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/971,291

(22) Filed: May 4, 2018

(65) Prior Publication Data

US 2018/0350782 A1    Dec. 6, 2018

Related U.S. Application Data

(60) Provisional application No. 62/512,733, filed on May 31, 2017, provisional application No. 62/527,198, filed on Jun. 30, 2017.

(30) Foreign Application Priority Data

Dec. 27, 2017   (CN) .......................... 2017 1 1444797

(51) Int. Cl.
| | | |
|---|---|---|
| *H01L 25/075* | (2006.01) | |
| *H01L 27/00* | (2006.01) | |
| *H01L 33/00* | (2010.01) | |
| *H01L 33/38* | (2010.01) | |
| *H01L 33/62* | (2010.01) | |
| *H01L 27/12* | (2006.01) | |
| *H01L 33/06* | (2010.01) | |
| *H01L 33/44* | (2010.01) | |

(52) U.S. Cl.
CPC ...... *H01L 25/0753* (2013.01); *H01L 27/1214* (2013.01); *H01L 33/06* (2013.01);
(Continued)

(58) Field of Classification Search
CPC ... H01L 25/0753; H01L 25/075; H01L 25/50; H01L 27/1214; H01L 27/12; H01L 27/15;
(Continued)

(56) References Cited

U.S. PATENT DOCUMENTS

| | | | |
|---|---|---|---|
| 7,381,842 B2 * | 6/2008 | Kunimoto | ............. A61K 6/083 548/444 |
| 9,312,249 B2 * | 4/2016 | Choi | ....................... H01L 33/20 |

(Continued)

FOREIGN PATENT DOCUMENTS

| | | |
|---|---|---|
| EP | 2 149 161 | 2/2010 |
| WO | 2008/131743 A1 | 11/2008 |
| WO | 2014/140796 A1 | 9/2014 |

OTHER PUBLICATIONS

European Search Report dated Jan. 28, 2019, issued in application No. EP. 18172744.7.
(Continued)

*Primary Examiner* — Nikolay K Yushin
(74) *Attorney, Agent, or Firm* — McClure, Qualey & Rodack, LLP

(57) ABSTRACT

A display device is provided. The display device includes a substrate, and a light-emitting unit disposed on the substrate. The light-emitting unit includes a first conductive layer overlapping a second conductive layer, a first semiconductor layer disposed between the first conductive layer and the second conductive layer, a second semiconductor layer disposed between the first semiconductor layer and the first conductive layer, a quantum well structure disposed between the first semiconductor layer and the second semiconductor layer, and a via hole penetrated through the first semiconductor layer and the quantum well structure. The second conductive layer is electrically connected with the second semiconductor layer through a conductive material disposed in the via hole.

19 Claims, 29 Drawing Sheets

(52) U.S. Cl.
 CPC ............ *H01L 33/382* (2013.01); *H01L 33/44* (2013.01); *H01L 33/62* (2013.01); *H01L 2933/0066* (2013.01)

(58) Field of Classification Search
 CPC ....... H01L 33/382; H01L 33/62; H01L 33/44; H01L 33/38; H01L 33/06; H01L 33/387; H01L 33/486; H01L 33/48; H01L 2933/0066; H01L 2933/0091; H01L 2933/0016
 See application file for complete search history.

(56) References Cited

U.S. PATENT DOCUMENTS

| | | | | |
|---|---|---|---|---|
| 9,318,647 | B2* | 4/2016 | Kim | ................ H01L 21/76251 |
| 9,691,948 | B2* | 6/2017 | Lin | ........................ H01L 33/54 |
| 2005/0191567 | A1* | 9/2005 | Kunimoto | .............. A61K 6/083 |
| | | | | 430/7 |
| 2009/0065800 | A1 | 3/2009 | Wirth et al. | |
| 2010/0276706 | A1 | 11/2010 | Herrmann | |
| 2015/0084537 | A1* | 3/2015 | Choi | ....................... H01L 33/20 |
| | | | | 315/250 |
| 2015/0207026 | A1* | 7/2015 | Kim | .................... H01L 33/0075 |
| | | | | 438/26 |
| 2016/0099383 | A1 | 4/2016 | Yuh | |
| 2017/0069611 | A1 | 3/2017 | Zhang et al. | |
| 2017/0069804 | A1* | 3/2017 | Lin | ........................ H01L 33/54 |
| 2017/0077353 | A1 | 3/2017 | Kim et al. | |

OTHER PUBLICATIONS

Partial Search Report dated Oct. 12, 2018, issued in application No. EP 18172744.7.

* cited by examiner

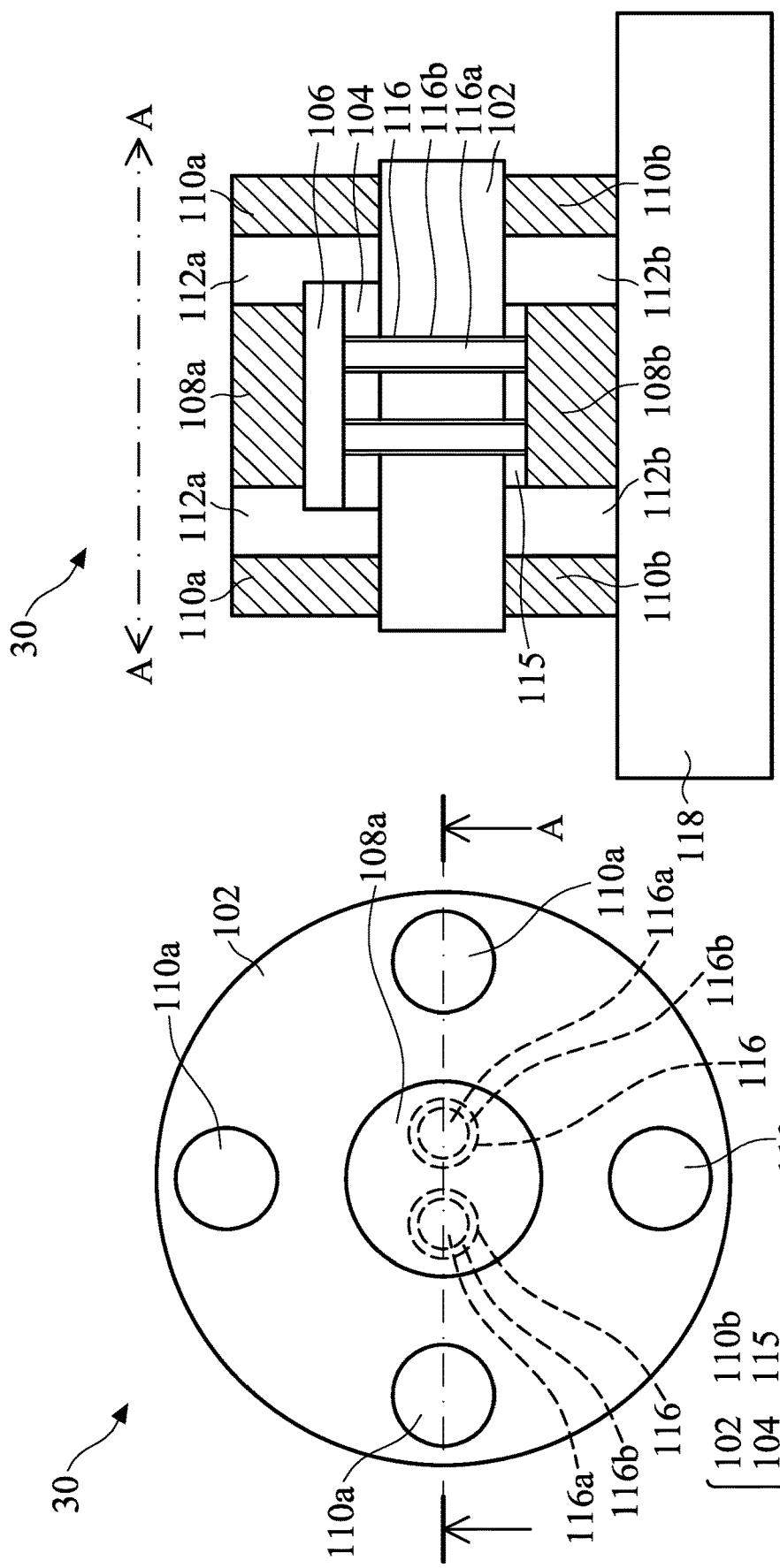

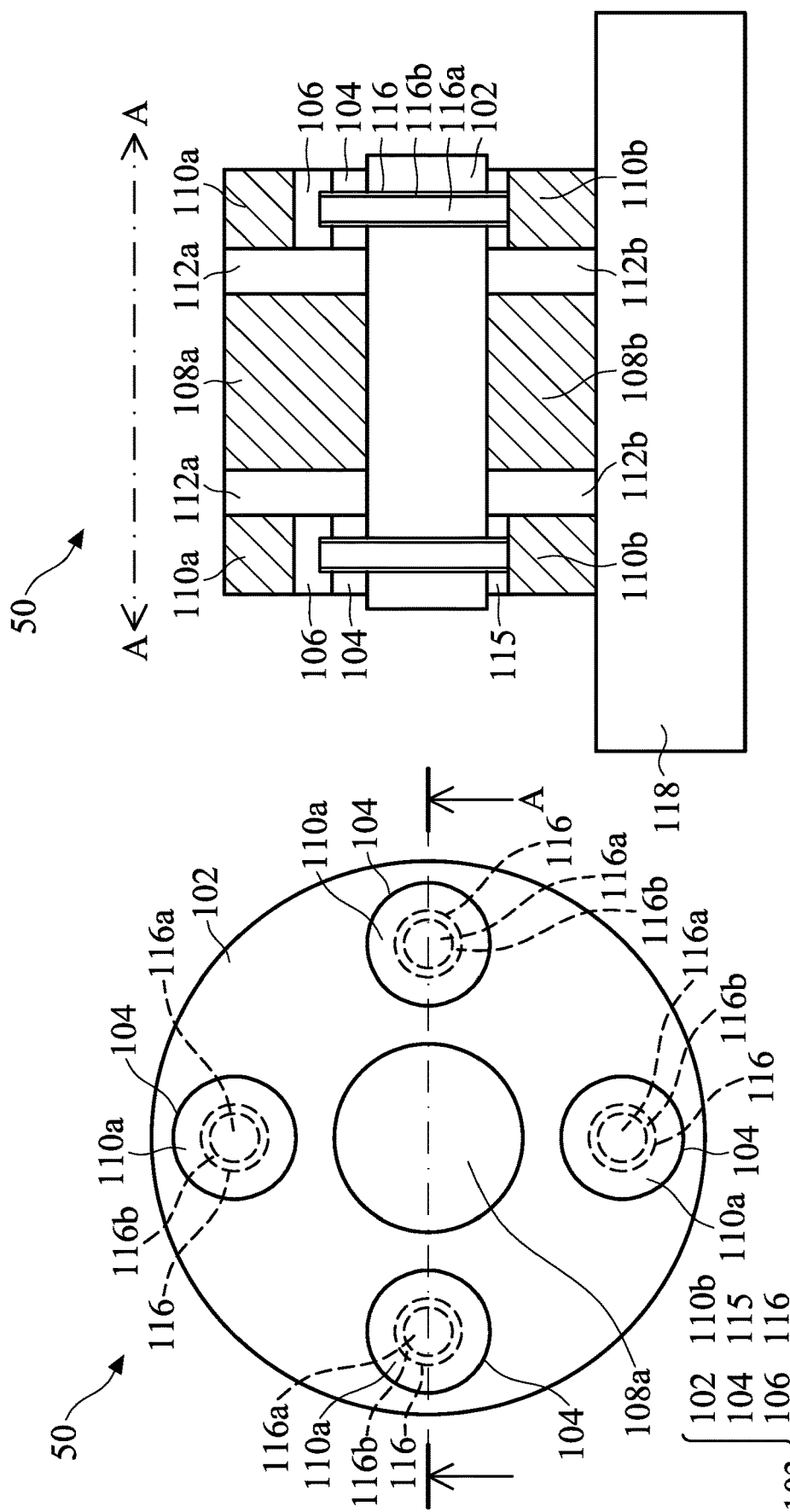

DISPLAY DEVICE AND METHOD FOR FORMING THE SAME

CROSS REFERENCE TO RELATED APPLICATIONS

This application claims priority of provisional application of U.S. Patent Application No. 62/527,198 filed on Jun. 30, 2017, provisional application of U.S. Patent Application No. 62/512,733 filed on May 31, 2017, and China Patent Application No. 201711444797.4 filed on Dec. 27, 2017, the entirety of which are incorporated by reference herein.

BACKGROUND

Technical Field

The present disclosure relates to display devices, and in particular to display devices that include light-emitting units.

Description of the Related Art

As digital technology develops, display devices are becoming more widely used in our society. For example, display devices have been applied in modern information and communication devices such as televisions, notebooks, computers, and mobile phones (e.g., smartphones). In addition, each generation of display devices has been developed to be thinner, lighter, smaller, and more fashionable than the previous generation.

Among the various types of display devices available, light-emitting diode (LED) display devices are gaining in popularity, since LEDs have advantages such as high efficiency and a long life span.

However, existing LED display devices have not been satisfactory in every respect.

BRIEF SUMMARY

Some embodiments of the present disclosure provide a display device. The display device includes a substrate, and a light-emitting unit disposed on the substrate. The light-emitting unit includes a first conductive layer overlapping a second conductive layer, a first semiconductor layer disposed between the first conductive layer and the second conductive layer, a second semiconductor layer disposed between the first semiconductor layer and the first conductive layer, a quantum well structure disposed between the first semiconductor layer and the second semiconductor layer, and a via hole penetrated through the first semiconductor layer and the quantum well structure. A conductive material is disposed in the via hole. The second conductive layer is electrically connected with the second semiconductor layer through the conductive material. In these embodiments, conductive layers are disposed on the upper side of the light-emitting unit and lower side of the light-emitting unit. The upper side of the light-emitting unit is opposite to the lower side of the light-emitting. Therefore, the upper side and lower side of the light-emitting unit can be used to connect with the substrate of the display device, and the flexibility of the process of manufacturing the display device may be improved.

Some embodiments of the present disclosure provide a method for forming a display device. The method includes providing a substrate. A plurality of bonding pads are disposed on the substrate. The method also includes forming an adhesion layer on the substrate to cover the plurality of bonding pads, forming a patterned adhesion layer by a lithography process to correspond to the plurality of bonding pads, and bonding a light-emitting unit to at least one of the bonding pads through the patterned adhesion layer. In these embodiments, since the patterned adhesion layer is formed by the lithography process, the formed pattern may have a smaller size and thus can be applied to bond the light-emitting unit having a small size and the substrate of the display device.

Some embodiments of the present disclosure provide a display device. The display device includes a substrate, and a first light-emitting unit and a second light-emitting unit disposed on the substrate. The first light-emitting unit is adjacent to the second light-emitting unit. In a first direction, the first light-emitting unit has a length $P_1$, and the first light-emitting unit and the second light-emitting unit have a spacing $Z_1$. The display device also includes a first adhesion layer disposed between the substrate and the first light-emitting unit, a second adhesion layer disposed between the substrate and the second light-emitting unit. In the first direction, the first adhesion layer and the second adhesion layer have a spacing $Z_3$. The spacing $Z_1$, the spacing $Z_3$, and the length $P_1$ is conformed to the following formula: $0<Z_3<(Z_1+P_1)$, and each of $Z_1$, $Z_3$, and $P_1$ is greater than zero micrometer. In these embodiments, by adjusting the length $P_1$ of the first light-emitting unit, the spacing $Z_1$ of the adjacent light-emitting units, and the spacing $Z_3$ of the adjacent adhesion layers to conform to the formula "$0<Z_3<(Z_1+P_1)$", the problem of poor electrical connection between the light-emitting units and the substrate of the display device resulting from insufficient adhesion caused by the adhesive areas between the adhesion layers and the light-emitting units being too small may be improved.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

FIG. 3A and FIG. 3B respectively illustrate a top view and a cross-sectional view of the display device 30 according to some embodiments of the present disclosure.

FIG. 5A and FIG. 5B respectively illustrate a top view and a cross-sectional view of the display device 50 according to some embodiments of the present disclosure.

DETAILED DESCRIPTION

Figure 1A:
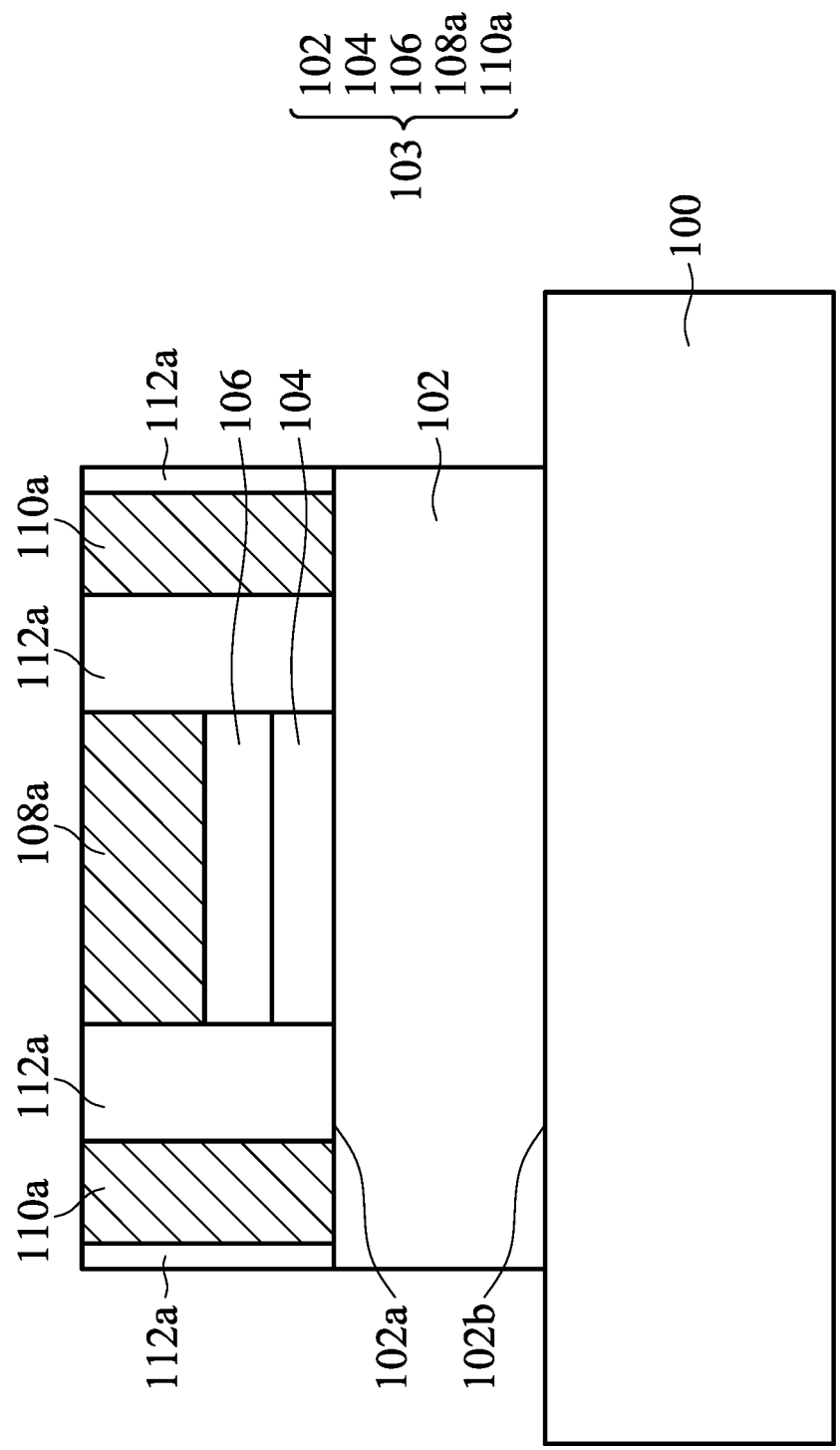
FIGS. 1A, 1B, 1C, 1D, and 1F are a series of cross-sectional views illustrating a method for forming the light-emitting unit according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various embodiments. This repetition is for simplicity and clarity and does not in itself dictate a relationship between the various embodiments and/or configurations discussed.

Some embodiments of the present disclosure will be described below. Additional operations may be provided before, during, and/or after the steps described in these embodiments. Some of the steps described may be replaced or omitted in different embodiments. In addition, although some embodiments of the present disclosure will be discussed in the following paragraphs with several steps in a specific order, these steps may be performed in another reasonable order.

Embodiment 1

The light-emitting unit of this embodiment has conductive layers on the upper side and the lower side opposite to the upper side, and thus the upper side and the lower side of the light-emitting unit can be used to connect with the substrate of the display device. Therefore, the flexibility of the manufacturing process for forming the display device may be improved. For example, the conductive layers may be the electrodes of the light-emitting unit, and the substrate of the display device may be a thin-film transistor (TFT) substrate.

For example, when gases or liquids are used to transfer the light-emitting unit onto the substrate in a flowing method or a vibrating method, the surface of the light-emitting unit contacting the substrate is random. If the conventional light-emitting unit, in which the conductive layers are formed only on one side, is used, the side of the light-emitting unit contacting the substrate may be without the conductive layers which can electrically connect the light-emitting unit with the substrate, and thus the light-emitting unit cannot be driven to emit the light.

In the following paragraphs, a method for forming the light-emitting unit of this embodiment will be discussed by way of example with reference to FIGS. 1A-1F.

As shown in FIG. 1A, a substrate 100 is provided. In an embodiment, the substrate 100 may be an epitaxial substrate (e.g., a sapphire substrate). In some other embodiments, the substrate 100 may include SiC substrate, Si substrate, $MgAl_2O_4$ substrate, MgO substrate, $LiAlO_2$ substrate, $LiGaO_2$ substrate, GaN substrate, GaAs substrate, GaP substrate, glass substrate, other applicable substrates, or a combination thereof. However, the present disclosure is not limited thereto.

In some embodiments, the substrate 100 may include a buffer layer (not shown in the figure) to reduce the defects caused by the lattice mismatch between the substrate 100 and the semiconductor layer on the substrate 100. For example, the buffer layer may include, for example, aluminum nitride (AlN), aluminum gallium nitride (AlGaN), other applicable materials, or a combination thereof, but the present disclosure is not limited thereto.

Still referring to FIG. 1A, a light-emitting unit 103 may be formed on the substrate 100. For example, the light-emitting unit 103 may be a light-emitting diode (e.g., a blue light-emitting diode, a red light-emitting diode, or a green light-emitting diode). In some embodiments, as shown in FIG. 1A, the light-emitting unit 103 includes a first semiconductor layer 102, a second semiconductor layer 106 vertically stacked on the first semiconductor layer 102, and a quantum well structure 104 disposed between the first semiconductor layer 102 and the second semiconductor layer 106.

For example, the first semiconductor layer 102, the quantum well structure 104, and the second semiconductor layer 106 may be sequentially formed on the substrate 100 (e.g., a sapphire substrate) through epitaxial processes, but the present disclosure is not limited thereto. For example, the epitaxial process may include molecular-beam epitaxy (MBE), metalorganic chemical vapor deposition (MOCVD), hydride vapor phase epitaxy (HVPE), other applicable epitaxial processes, or a combination thereof. In some embodiments, the first semiconductor layer 102, the second semiconductor layer 106, and the quantum well structure 104 may be formed by the same process, the first semiconductor layer 102, the second semiconductor layer 106, and the quantum well structure 104 may have different dopants, and the first semiconductor layer 102, the second semiconductor layer 106, and the quantum well structure 104 may have different doping concentrations.

In some embodiments, the first semiconductor layer 102, the quantum well structure 104, and the second semiconductor layer 106 may be patterned by an applicable patterning process. For example, the patterning process may include a lithography process, an etching process, other applicable processes, or a combination thereof. In some embodiments, the lithography process may include photoresist coating, soft baking, exposure, post-exposure baking, developing photoresist, other applicable processes, or a combination thereof, and the etching process may include a wet etching process, a dry etching process, other applicable processes, or a combination thereof.

For example, the first semiconductor layer 102, the second semiconductor layer 106, and the quantum well structure 104 may each include, for example, GaN, AlGaN, AlN, GaAs, GaInP, AlGaAs, InP, InAlAs, InGaAs, AlGaInP, other applicable III-V group semiconductor materials, or a combination thereof, but the present disclosure is not limited thereto. In some embodiments, the first semiconductor layer 102 and the second semiconductor layer 106 may be doped with different types of dopants. The first semiconductor layer 102 may be doped with n-type dopants, and the second semiconductor layer 106 may be doped with p-type dopants. For example, the first semiconductor layer 102 and the second semiconductor layer 106 may be doped by ion implantation or in-situ doping. For example, in this embodiment, the first semiconductor layer 102 is made of n-type GaN doped with dopants such as silicon or oxygen, the second semiconductor layer 106 is made of p-type GaN doped with dopants such as Mg, and the quantum well structure 104 may include a stacked structure formed of InGaN and GaN stacking one another. In the stacked structure, the possibility of the recombination of the electrons and the holes may be increased, and thus the light-emitting efficiency may be increased.

Still referring to FIG. 1A, the light-emitting unit 103 further includes a first conductive layer 108a and a third conductive layer 110a disposed on a side of the light-emitting unit 103. In detail, the first conductive layer 108a and the third conductive layer 110a may be disposed on a first side 102a of the first semiconductor layer 102. In some embodiments, the third conductive layer 110a may be adjacent to the first conductive layer 108a. As shown in FIG. 1A, the first conductive layer 108a may be electrically connected with the second semiconductor layer 106, and the third conductive layer 110a may be electrically connected with the first semiconductor layer 102. In some embodiments, the first conductive layer 108a is in direct contact with the second semiconductor layer 106, and the third conductive layer 110a is in direct contact with the first semiconductor layer 102.

In some embodiments, the materials of the first conductive layer 108a and the third conductive layer 110a may include metals, other applicable conductive materials, or a combination thereof, but the present disclosure is not limited thereto. The metals may include, for example, Cu, W, Ag, Sn, Ni, Cr, Ti, Pb, Au, Bi, Sb, Zn, Zr, Mg, In, Te, Ga, other applicable metals, alloys thereof, and combinations thereof. In some other embodiments, the materials of the first conductive layer 108a and the third conductive layer 110a may be transparent conductive materials, and the transparent conductive materials may include, for example, ITO, SnO, IZO, IGZO, ITZO, ATO, AZO, other applicable transparent conductive materials, or a combination thereof, but the present disclosure is not limited thereto.

In some embodiments, a blanket layer of metal, or a blanket layer of transparent conductive material may be formed on the first semiconductor layer 102 and the second semiconductor layer 106 by a physical vapor deposition process (e.g., an evaporation process or a sputtering process), an electroplating process, an atomic layer deposition process, other applicable processes, or a combination thereof, and then the blanket layer of metal, or the blanket layer of transparent conductive material may be patterned by a patterning process (e.g., a lithography process and an etching process) to form the first conductive layer 108a and the third conductive layer 110a.

Still referring to FIG. 1A, in some embodiments, a protection layer 112a may be optionally formed on the first semiconductor layer 102, depending on design requirements. The protection layer 112a may at least partially fill the gap between the first conductive layer 108a and the third conductive layer 110a, thus increasing the reliability of the light-emitting unit 103. For example, the protection layer 112a may include organic materials (e.g., including acrylic-based material), inorganic materials (e.g., including silicon oxide, or silicon nitride), other applicable materials, or a combination thereof. In some embodiments, the protection layer 112a may include a silicon-based material, but the present disclosure is not limited thereto. In some embodiments, the protection layer 112a may be formed using a spin-on coating process, a chemical vapor deposition process (e.g., a plasma-enhanced chemical vapor deposition process), other applicable processes, or a combination thereof, but the present disclosure is not limited thereto.

Figure 1B:
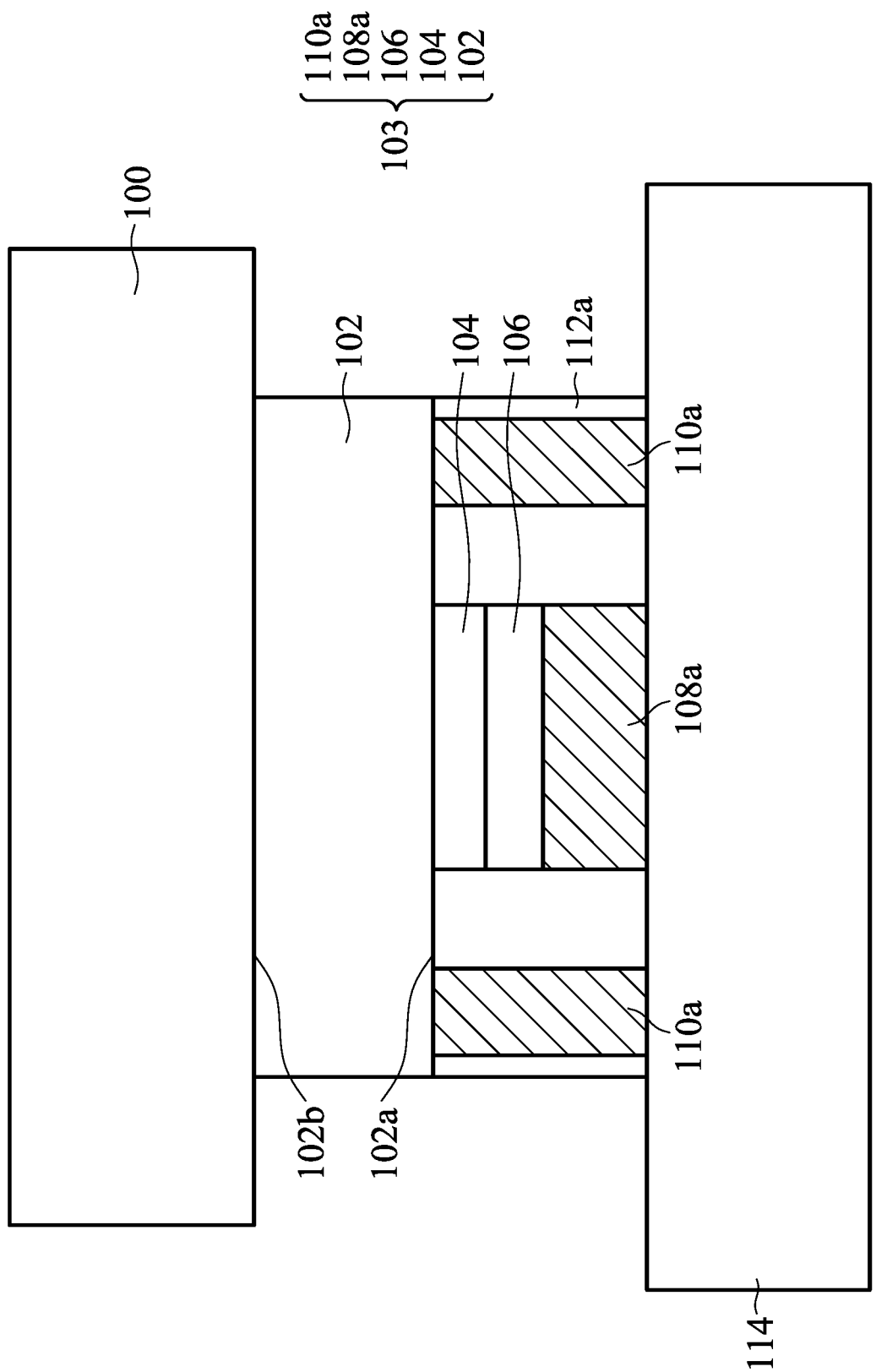

Then, as shown in FIG. 1B, the substrate 100 and the light-emitting unit 103 may be flipped over, and the light-emitting unit 103 may be bonded to the temporary substrate 114. As shown in FIG. 1B, the substrate 100 and the temporary substrate 114 are respectively disposed on two opposite sides of the light-emitting unit 103. For example, the temporary substrate 114 may comprise silicon, glass, polyimide (PI), polyethylene terephthalate (PET), other applicable materials, or a combination thereof, but the present disclosure is not limited thereto. In some embodiments, the light-emitting unit 103 may be bonded to the temporary substrate 114 through an adhesion layer (not shown in the figure). For example, the adhesion layer may include, for example, a thermal curing material and/or a light curing material, but the present disclosure is not limited thereto.

Figure 1C:
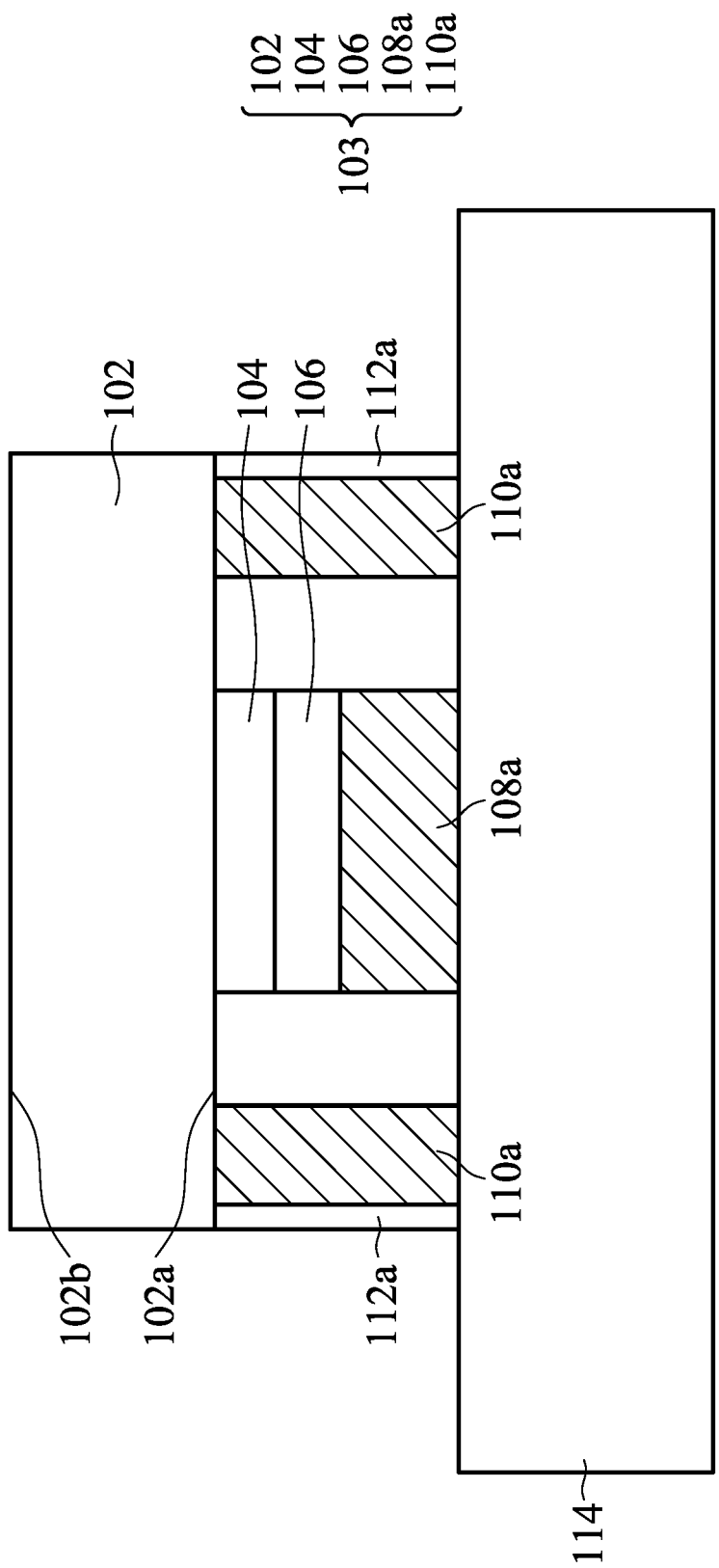

Then, as shown in FIG. 1C, the substrate 100 is removed. In this embodiment, the substrate 100 is removed by a laser lift-off process. For example, the laser source of the laser lift-off process may include excimer laser, pico laser, femto laser, other applicable laser sources, or a combination thereof, but the present disclosure is not limited thereto. In some other embodiments, the substrate 100 may be removed by a mechanical peeling process, a grinding process, an etching process, other applicable processes, or a combination thereof, but the present disclosure is not limited thereto.

Figure 1D:
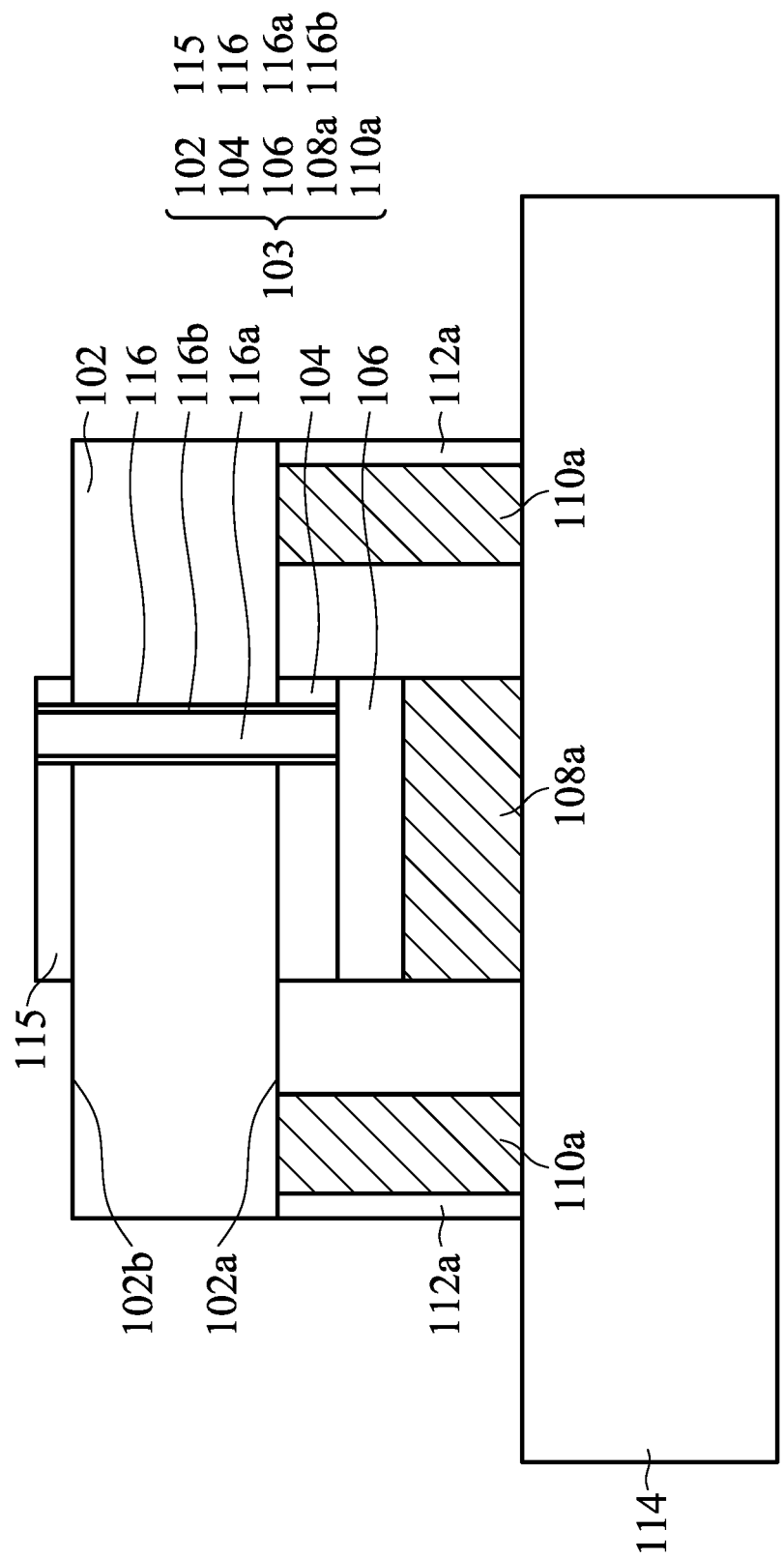

Then, as shown in FIG. 1D, a second insulating layer 115 may be formed on a second side 102b of the first semiconductor layer 102. For example, the second insulating layer 115 may include organic materials (e.g., including acrylic-based material), inorganic materials (e.g., including silicon oxide, or silicon nitride), other applicable materials, or a combination thereof, but the present disclosure is not limited thereto. In some embodiments, the second insulating layer 115 may be formed using a spin-on coating process, a chemical vapor deposition process (e.g., a plasma-enhanced chemical vapor deposition process), a screen printing process, other applicable processes, or a combination thereof, and the second insulating layer 115 may be patterned, for example, by a lithography process and an etching process. For example, the lithography process and the etching process discussed herein may be similar to, or the same as the lithography process and the etching process discussed above.

Then, still referring to FIG. 1D, a via hole 116 is formed, and a first insulating layer 116b and a conductive material 116a are formed in the via hole 116. The first insulating layer 116b may be between the via hole 116 and the conductive material 116a. In some embodiments, as shown in FIG. 1D, the via hole 116 penetrates through the second insulating layer 115, the first semiconductor layer 102, and the quantum well structure 104, and the conductive material 116a is electrically connected with the second semiconductor layer 106. For example, the conductive material 116a may be in direct contact with the second semiconductor layer 106, or may be electrically connected with the second semiconductor layer 106 through other conductive elements.

As shown in FIG. 1D, in some embodiments, the first insulating layer 116b may be disposed around the sidewall of the conductive material 116a. In some embodiments, the first insulating layer 116b may be disposed between the sidewall of the via hole 116 and the conductive material 116a. Furthermore, in some embodiments, as shown in FIG. 1D, the first insulating layer 116b may be disposed around the sidewall of the conductive material 116a while still exposing the top surface and/or the bottom surface of the conductive material 116a. For example, the first insulating layer 116b may separate the conductive material 116a from the first semiconductor layer 102, and the first insulating layer 116b may separate the conductive material 116a from the quantum well structure 104. In other words, the first insulating layer 116b may be disposed between the conductive material 116a and the first semiconductor layer 102, and the first insulating layer 116b may be disposed between the conductive material 116a and the quantum well structure 104. For example, a mechanical drilling process, a laser drilling process, a dry etching process, a wet etching process, other applicable processes, or a combination thereof may be used to form the via hole 116 which penetrates through the second insulating layer 115, the first semiconductor layer 102, and the quantum well structure 104, and then an atomic layer deposition process, a chemical vapor deposition process, other applicable processes, or a combination thereof may be used to form an insulating layer on the hole wall and the bottom of the via hole 116, and then the insulating layer on the bottom of the via hole 116 may be removed through an etching process while the insulating layer on the hole wall of the via hole 116 may be left to serve as the first insulating layer 116b. For example, the first insulating layer 116b may include silicon oxide ($SiO_2$), silicon nitride ($SiN_x$), other applicable insulating materials, or a combination thereof. The chemical vapor deposition process may include, for example, a high-density plasma chemical vapor deposition process, a low-pressure chemical vapor deposition process, or a plasma-enhanced chemical vapor deposition process. The etching process may include, for example, an anisotropic etching process, but the present disclosure is not limited thereto.

Then, a physical vapor deposition process (e.g., an evaporation process or a sputtering process), an electroplating process, an atomic layer deposition process, other applicable processes, or a combination thereof may be used to deposit Cu, W, Ag, Sn, Ni, Cr, Ti, Pb, Au, Bi, Sb, Zn, Zr, Mg, In, Te, Ga, alloys thereof, other applicable conductive materials, and combinations thereof in the via hole 116 to form the conductive material 116a. In some embodiments, a process such as a chemical-mechanical-polishing (CMP) process or an etch back process may be performed to remove the excess conductive material outside the via hole 116 after the step of depositing the conductive material. In some embodiments, the conductive material 116a may include acid-resistant metals (e.g., including Cu, Ag, Au, or Pt).

Figure 1E:
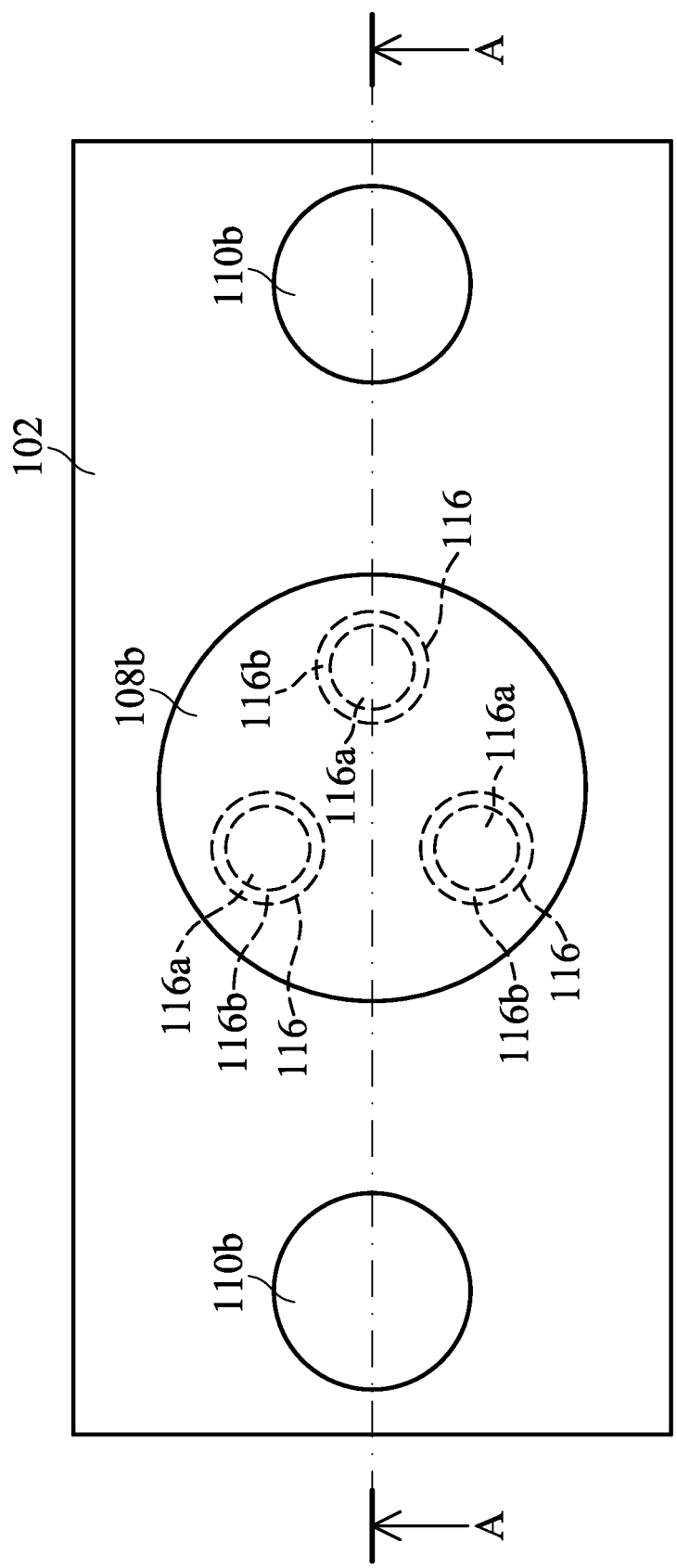
FIG. 1E illustrates a top view of the light-emitting unit according to some embodiments of the present disclosure.
Figure 1F:
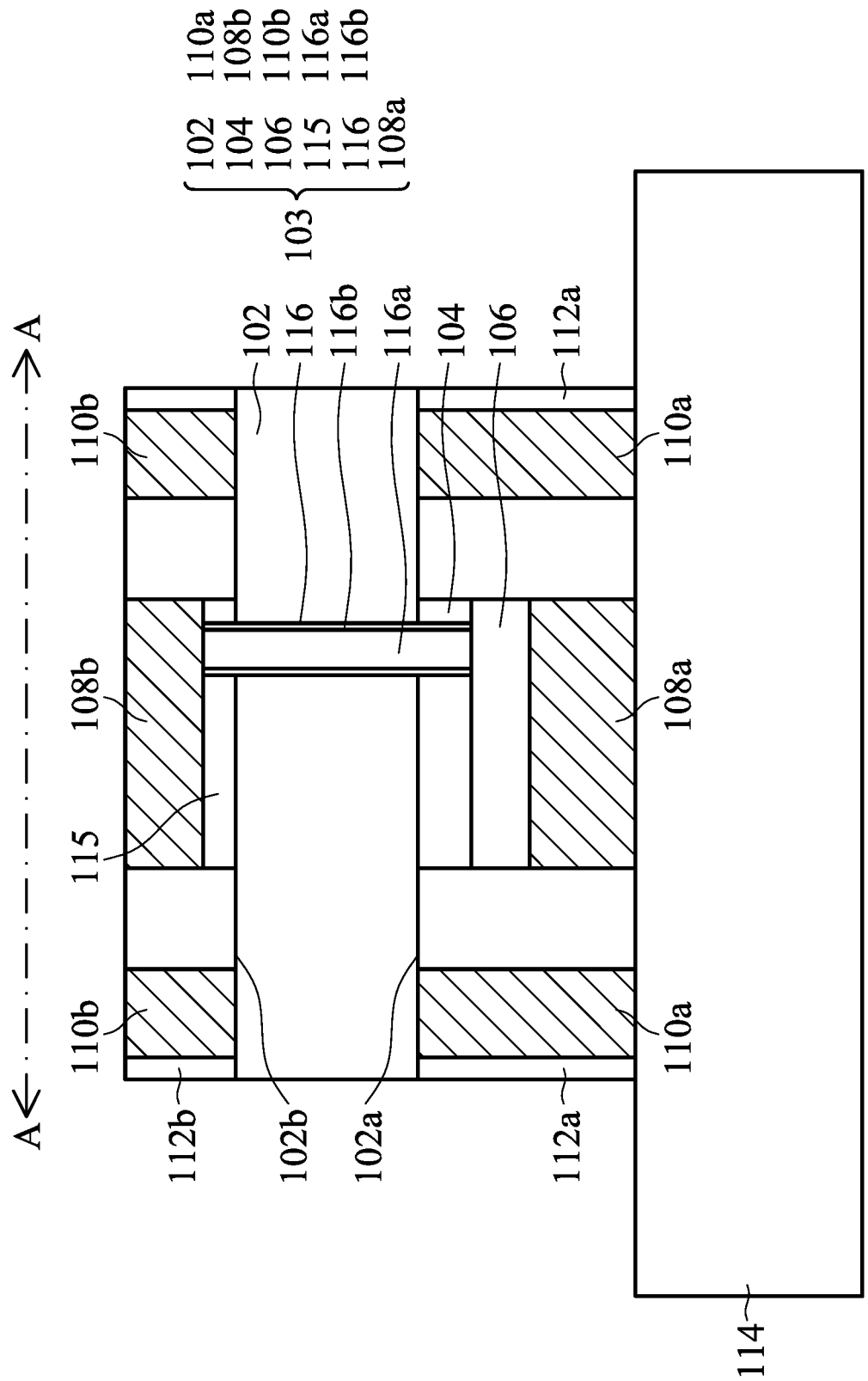

Then, as shown in FIG. 1E and FIG. 1F, a second conductive layer 108b and a fourth conductive layer 110b are formed on the second side 102b of the first semiconductor layer 102 to form the light-emitting unit 103 which has conductive layers on the upper side and the lower side being opposite to the upper side. In detail, FIG. 1E is a partial process top view of the method of forming the light-emitting unit of this embodiment, and FIG. 1F is a cross-sectional view taken along the cut line A-A of FIG. 1E. It should be noted that the protection layer 112b is not shown in FIG. 1E for simplicity and clarity.

Generally speaking, the function, and/or the position, and/or the dimension of the second conductive layer 108b and the fourth conductive layer 110b on the second side 102b of the first semiconductor layer 102 correspond to those of the first conductive layer 108a and the third conductive layer 110a on the first side 102a of the first semiconductor layer 102. In some embodiments, the second conductive layer 108b may be electrically connected with the second semiconductor layer 106, and the fourth conductive layer 110b may be electrically connected with the first semiconductor layer 102. Furthermore, in some embodiments, the second conductive layer 108b is electrically connected with the second semiconductor layer 106 through the conductive material 116a in the via hole 116, and the fourth conductive layer 110b is in direct contact with the first semiconductor layer 102.

In some embodiments, from a top view, the area of the second conductive layer 108b on the second side 102b of the first semiconductor layer 102 is substantially equal to the area of the first conductive layer 108a on the first side 102a of the first semiconductor layer 102, and the area of the fourth conductive layer 110b on the second side 102b of the first semiconductor layer 102 is substantially equal to the area of the third conductive layer 110a on the first side 102a of the first semiconductor layer 102. In some embodiments, the second conducive layer 108b and the fourth conductive layer 110b on the second side 102b of the first semiconductor layer 102, and the first conductive layer 108a and the third conductive layer 110a on the first side 102a of the first semiconductor layer 102 are mirror symmetrical. In some embodiments, the fourth conductive layer 110b may be adjacent to the second conductive layer 108b. In some embodiments, the second conductive layer 108b may overlap the first conductive layer 108a, and/or the fourth conductive layer 110b may overlap the third conductive layer 110a (e.g., in a top view).

In should be understood that although the light-emitting unit 103 of this embodiment includes three via holes 116, but the present disclosure is not limited thereto. In some other embodiments, a different number of via holes 116 (e.g., one to twenty via holes 116) may be formed, according to design requirements, and the first insulating layer 116b and the conductive material 116a may be formed in these via holes 116. For example, in some embodiments, the light-emitting unit 103 may include one or two via holes 116.

Figure 1G:
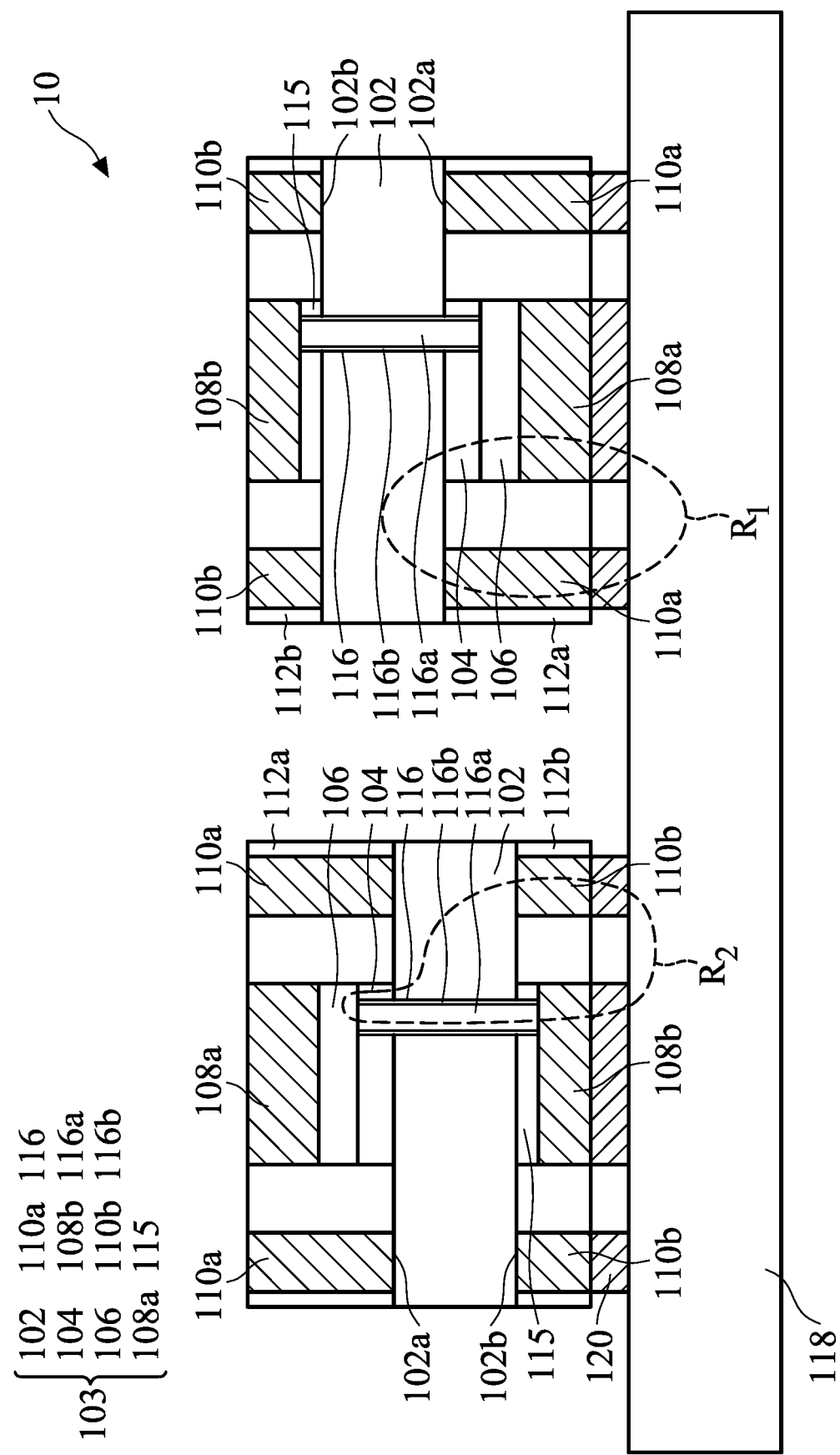
FIG. 1G illustrates a cross-sectional view of the display device 10 according to some embodiments of the present disclosure.

FIG. 1G illustrates a partial cross-sectional view of the display device 10 according to some embodiments of the present disclosure. As shown in FIG. 1G, the light-emitting units 103 are disposed on the substrate 118, and the temporary substrate 114 is removed. The display device 10 includes the light-emitting units 103 containing the via holes 116 of the above embodiments, and the light-emitting units 103 are electrically connected with the substrate 118. For example, the substrate 118 may include one or more active elements (not shown in the figure) such as transistors. For example, the substrate 118 may be a TFT substrate, but the present disclosure is not limited thereto. In some embodiments, a driving circuit (not shown in the figure) may be disposed on the substrate 118, and the light-emitting units 103 may be disposed on the driving circuit and electrically connected with the driving circuit.

The one or more active elements may be electrically connected with the light-emitting units 103. In some embodiments, the one or more active elements may control or adjust the driving signal (e.g., current signal) transmitted to the light-emitting units 103, so as to adjust the brightness of the light-emitting units 103. In some embodiments, multiple light-emitting units 103 may be electrically connected with a different active element respectively. In other words, the driving signals transmitted to the multiple light-emitting units 103 may be separately controlled through their own corresponding active element to achieve the purpose of local dimming control.

As shown in FIG. 1G, at least one bonding pad 120 may be disposed on the substrate 118. In some embodiments, the first conductive layer 108a and the third conductive layer 110a of the light-emitting unit 103, or the second conductive layer 108b and the fourth conductive layer 110b of the light-emitting unit 103 are electrically connected with the substrate 118 through the bonding pads 120.

In some embodiments, the first conductive layer 108a and the third conductive layer 110a of the light-emitting unit 103, or the second conductive layer 108b and the fourth conductive layer 110b of the light-emitting unit 103 may be bonded onto the bonding pads 120 by performing a bonding process such as a eutectic bonding process.

In some embodiments, the first conductive layer 108a and the third conductive layer 110a of the light-emitting unit 103, or the second conductive layer 108b and the fourth conductive layer 110b of the light-emitting unit 103 may be bonded onto the bonding pads 120 through an adhesion layer (not shown in the figure) such as anisotropic conductive film (ACF). For example, the anisotropic conductive film may include a plurality of conductive particles disposed therein. In some embodiments, the conductive particle may include a core portion made of a polymer, and a shell portion made of a metal or a metal alloy coated on the core portion.

As shown in FIG. 1G, when the light-emitting unit 103 is electrically connected with the bonding pads 120 by the first conductive layer 108a and the third conductive layer 110a on the first side 102a of the first semiconductor layer 102 (e.g., the right light-emitting unit 103 in FIG. 1G), the current can flow through the first conductive layer 108a, the second semiconductor layer 106, the quantum well structure 104, the first semiconductor layer 102 and the third conductive layer 110a via the path $R_1$ to enable the light-emitting unit 103 to achieve the function of emitting light.

Still referring to FIG. 1G, when the light-emitting unit 103 is electrically connected with the bonding pads 120 by the second conductive layer 108b and the fourth conductive layer 110b on the second side 102b of the first semiconductor layer 102 (e.g., the left light-emitting unit 103 in FIG. 1G), the current can flow through the second conductive layer 108b, the conductive material 116a in the via hole 116, the second semiconductor layer 106, the quantum well structure 104, the first semiconductor layer 102 and the fourth conductive layer 110b via the path $R_2$ to enable the light-emitting unit 103 to achieve the function of emitting light.

In some embodiments, since the second insulating layer 115 is disposed between the first semiconductor layer 102 and the second conductive layer 108b of the light-emitting unit 103, the current can flow through the second semiconductor layer 106 and the quantum well structure 104 via the conductive material 116a in the via hole 116 without flowing from the second conductive layer 108b to the fourth conductive layer 110b via the first semiconductor layer 102. In some embodiments, the first insulating layer 116b can separate the conductive material 116a from the first semiconductor layer 102 and separate the conductive material 116a from the quantum well structure 104, and thus the current could flow through the second semiconductor layer 106.

In some embodiments, the first conductive layer 108a and the third conductive layer 110a (or the second conductive layer 108b and the fourth conductive layer 110b) not bonded onto the substrate 118 may comprise transparent conductive materials. Therefore, in the display device 10, their impact on the emitting light of the light-emitting unit 103 may be reduced. For example, the transparent conductive materials may include, for example, ITO, SnO, IZO, IGZO, ITZO, ATO, AZO, other applicable transparent conductive materials, or a combination thereof, but the present disclosure is not limited thereto. For example, the first conductive layer 108a and the third conductive layer 110a on the first side 102a of the first semiconductor layer 102 of the left light-emitting unit 103 in FIG. 1G, and the second conductive layer 108b and the fourth conductive layer 110b on the second side 102b of the first semiconductor layer 102 of the right light-emitting unit 103 in FIG. 1G may comprise transparent conductive materials, and thus no additional processes need to be performed to remove them, and thus the process steps for forming the display device 10 may be reduced and the manufacturing time may also be reduced.

Figure 1H:
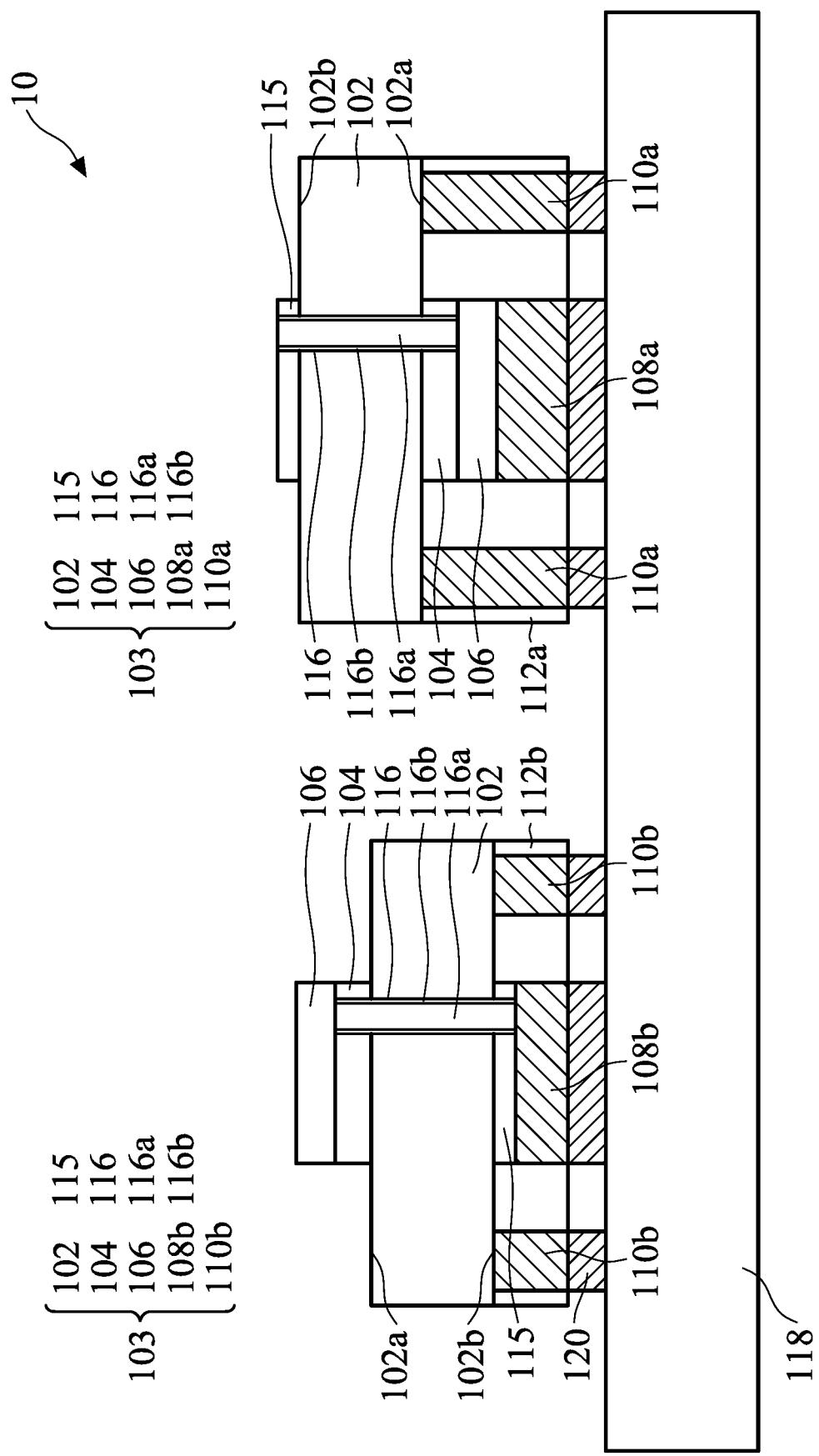
FIG. 1H illustrates a cross-sectional view of the display device 10 according to some embodiments of the present disclosure.

In some other embodiments, the first conductive layer 108a and the third conductive layer 110a (or the second conductive layer 108b and the fourth conductive layer 110b) not bonded onto the substrate 118 may comprise conductive materials which are not transparent (e.g., including metals such as Cu, W, Ag, Sn, Ni, Cr, Ti, Pb, Au, Bi, Sb, Zn, Zr, Mg, In, Te, or Ga). In these embodiments, if the first conductive layer 108a and the third conductive layer 110a (or the second conductive layer 108b and the fourth conductive layer 110b) not bonded onto the substrate 118 are left in the display device 10, the light-emitting unit 103 may not be able to properly emit the light. Therefore, in these embodiments, the first conductive layer 108a and the third conductive layer 110a (or the second conductive layer 108b and the fourth conductive layer 110b) not bonded onto the substrate 118 may be removed by performing a process such as an etching process and/or a grinding process. In other words, the first conductive layer 108a and the third conductive layer 110a (or the second conductive layer 108b and the fourth conductive layer 110b) not bonded onto the substrate 118 are not left in the final display device 10. For example, the second conductive layer 108b and the fourth conductive layer 110b on the second side 102b of the first semiconductor layer 102 of the right light-emitting unit 103, and the first conductive layer 108a and the third conductive layer 110a on the first side 102a of the first semiconductor layer 102 of the left light-emitting unit 103 may be removed by an etching process and/or a grinding process to form the display device 10 illustrated in FIG. 1H.

In some embodiments, the conducive material 116a in the via hole 116 may comprise acid-resistant metals (e.g., including Cu, Ag, Au, or Pt) in order to reduce the damages to the conducive material 116a in the via hole 116 and the further erosion of other elements in the light-emitting unit 103 caused by the above etching process. In addition, in some embodiments, the above etching process also removes the protection layer which is disposed on the same side as the first conductive layer 108a and the third conductive layer 110a (or the second conductive layer 108b and the fourth conductive layer 110b) not bonded onto the substrate 118 (e.g., the protection layer 112b of the right light-emitting unit 103 in FIG. 1G, and the protection layer 112a of the left light-emitting unit 103 in FIG. 1G are also removed).

In summary, before being bonded onto the substrate (e.g., a TFT substrate), the light-emitting unit of some embodiments of the present disclosure has conductive layers (e.g., electrodes) on two opposite sides thereof. Therefore, the opposite sides of the light-emitting unit can be used to connect with the substrate. In addition, in some embodiments, the light-emitting unit includes the via hole and the conductive material formed in the via hole discussed above, and thus the light-emitting unit can be electrically connected with the substrate to achieve a normal light-emitting function no matter which side of the light-emitting unit is used to connect with the substrate.

FIGS. 2A, 2B, 3A, 3B, 4A, 4B, 5A, and 5B illustrate some variation embodiments of the display device 10 of this embodiment. It should be noted that unless otherwise specified, in these variations of the embodiments, the elements the same as or similar to those discussed in the above embodiments will be denoted by the same reference numerals, and the forming methods thereof may also be the same as or similar to those discussed in the above embodiments.

Figures 2A, 2B:
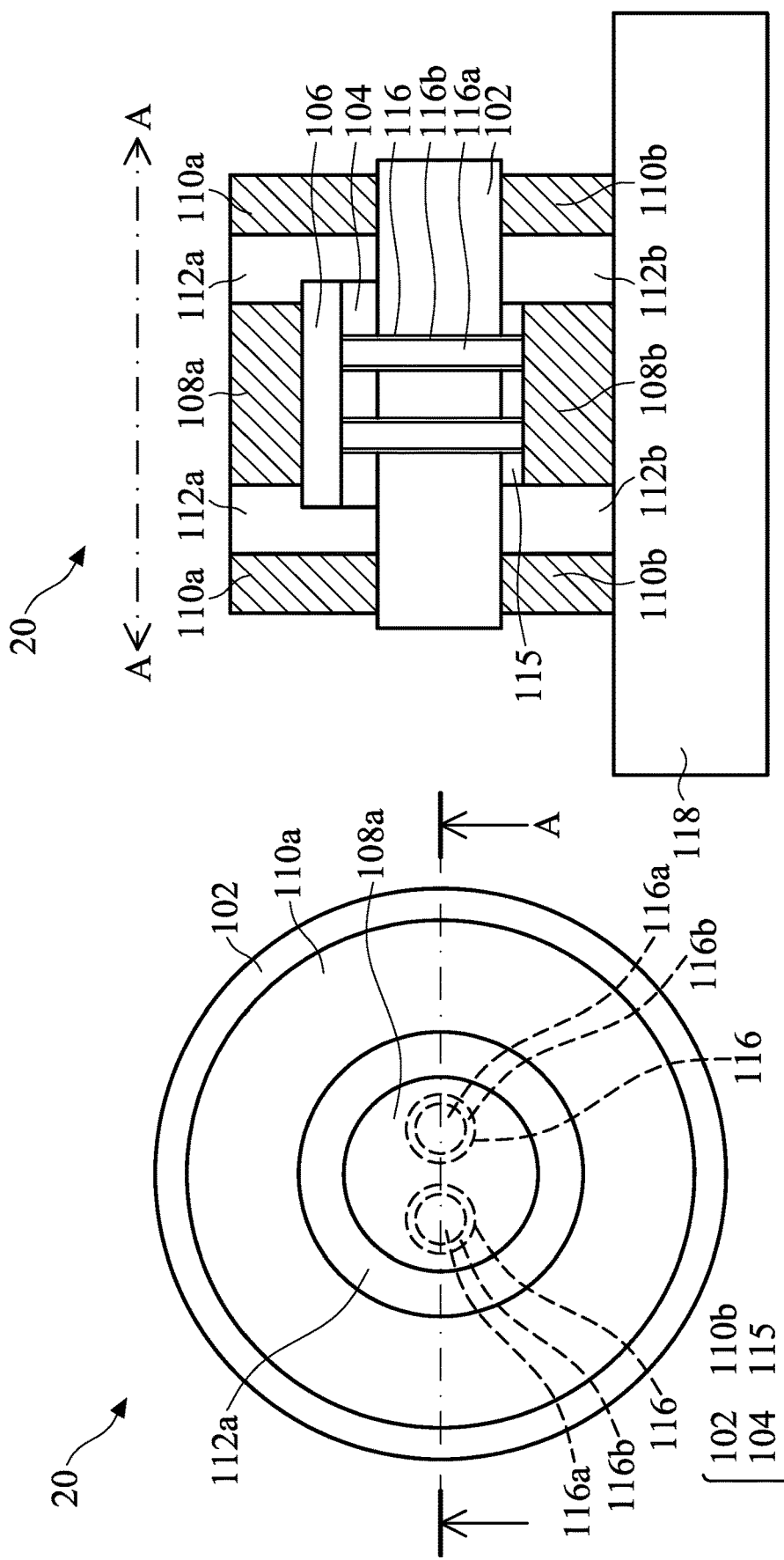
FIG. 2A and FIG. 2B respectively illustrate a top view and a cross-sectional view of the display device 20 according to some embodiments of the present disclosure.

FIG. 2A and FIG. 2B illustrate the display device 20 according to some embodiments of the present disclosure. In detail, FIG. 2A is a partial top view of the display device 20, and FIG. 2B is a cross-sectional view of the display device 20 taken along the cut line A-A of FIG. 2A. It should be noted that elements of the display device 20 are not all shown in FIG. 2A and FIG. 2B for simplicity and clarity.

One difference between the display device 20 and the display device 10 is that the appearance of the light-emitting unit 103 of the display device 20 is designed to be round or symmetrical polygon (e.g., in the top view 2A, the display device 20 is round) to reduce the loss of the emitting light caused by left-right asymmetry.

FIG. 3A and FIG. 3B illustrate the display device 30 according to some embodiments of the present disclosure. In detail, FIG. 3A is a partial top view of the display device 30, and FIG. 3B is a cross-sectional view of the display device 30 taken along the cut line A-A of FIG. 3A. It should be noted that elements of the display device 30 are not all shown in FIG. 3A and FIG. 3B for simplicity and clarity.

One difference between the display device 30 and the display device 20 is that the light-emitting unit 103 of the display device 30 includes a plurality of separate conductive layers. For example, as shown in FIG. 3A, in some embodiments, the light-emitting unit 103 includes four separate third conductive layers 110a on the side not bonded onto the substrate 118, and also includes four separate fourth conductive layers 110b on the side bonded onto the substrate 118. These conductive layers are separated from each other, and thus the lateral light emitted from the quantum well structure 104 of the light-emitting unit 103 being blocked may be reduced and the light-emitting efficiency may be improved. It should be understood that although the light-emitting unit 103 having four separate third conductive layers 110a or four separate fourth conductive layers 110b on one side is taken as an example herein for discussion, the present disclosure is not limited thereto. The light-emitting unit 103 may have another number of third conductive layers 110a or fourth conductive layers 110b on one side, depending on design requirements.

Figures 4A, 4B:
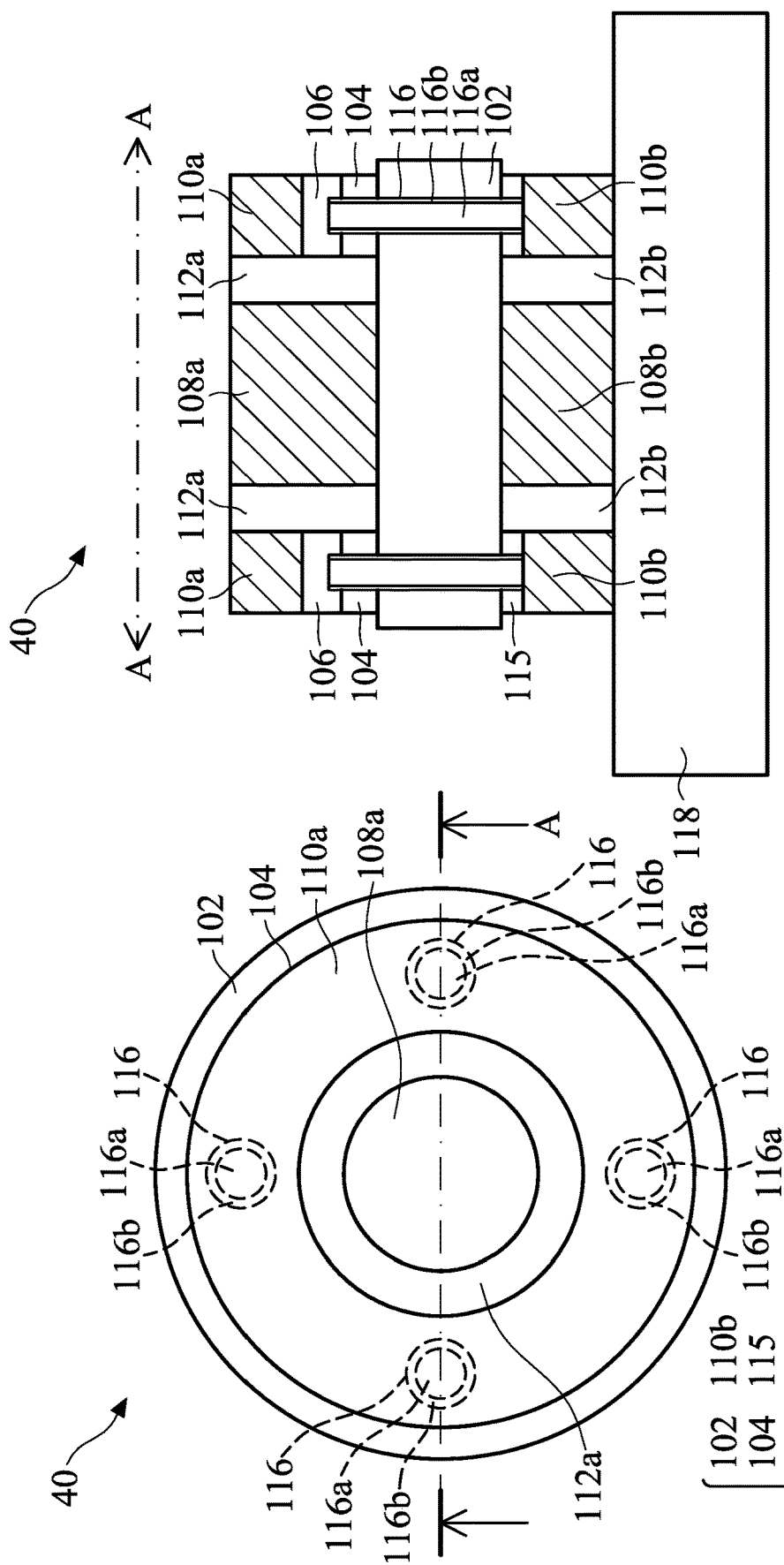
FIG. 4A and FIG. 4B respectively illustrate a top view and a cross-sectional view of the display device 40 according to some embodiments of the present disclosure.

FIG. 4A and FIG. 4B illustrate the display device 40 according to some embodiments of the present disclosure. In detail, FIG. 4A is a partial top view of the display device 40, and FIG. 4B is a cross-sectional view of the display device 40 taken along the cut line A-A of FIG. 4A. It should be noted that elements of the display device 40 are not all shown in FIG. 4A and FIG. 4B for simplicity and clarity.

As shown in FIG. 4A and FIG. 4B, one difference between the display device 40 and the display devices of the above embodiments is that the quantum well structure 104 of the light-emitting unit 103 of the display device 40 is disposed on the periphery of the light-emitting unit 103, and thus the lateral light emitted from the quantum well structure 104 of the light-emitting unit 103 may be more efficiently used and the light-emitting efficiency may be improved. As shown in FIG. 4B, in this embodiment, the via hole 116 and the conductive material 116a may partially penetrate into the second semiconductor layer 106 but not contact the third conductive layer 110a. In some other embodiments, as shown in FIG. 1D, the via hole 116 and the conductive material 116a do not penetrate into the second semiconductor layer 106, but the present disclosure is not limited thereto.

FIG. 5A and FIG. 5B illustrate the display device 50 according to some embodiments of the present disclosure. In detail, FIG. 5A is a partial top view of the display device 50, and FIG. 5B is a cross-sectional view of the display device 50 taken along the cut line A-A of FIG. 5A. It should be noted that elements of the display device 50 are not all shown in FIG. 5A and FIG. 5B for simplicity and clarity.

As shown in FIG. 5A and FIG. 5B, one difference between the display device 50 and the display device 40 of the above embodiment is that the light-emitting unit 103 of the display device 50 includes a plurality of separate quantum well structures 104, and thus the light-emitting efficiency may be improved. It should be understood that although the light-emitting unit 103 having four separate quantum well structures 104 is taken as an example herein for discussion, the present disclosure is not limited thereto. The light-emitting unit 103 may have a different number of quantum well structures 104, depending on design requirements.

It should be noted that although they are not shown in the figures, some additional elements (e.g., cover plates or optical films) may be formed on the display devices of the above embodiments. For example, the cover plates may comprise glass, indium tin oxide, polyimide, polyethylene terephthalate, other applicable materials, or a combination thereof, but the present disclosure is not limited thereto. For example, the optical films may include diffuser film, condenser lens, other applicable optical films, or a combination thereof, but the present disclosure is not limited thereto.

In addition, for the sake of explanation, some of the above figures only illustrate one light-emitting unit of the display device. However, a person having ordinary skill in the art should understand that the display device can include any applicable number of light-emitting units, depending on design requirements.

Embodiment 2

This embodiment provides a method for forming a display device by bonding light-emitting units (e.g., light-emitting diodes) onto a substrate (e.g., a TFT substrate). In this method, an adhesion layer is provided on a first substrate, and then portions of the adhesion layer are attached onto light-emitting units, and the light-emitting units are bonded onto a second substrate (e.g., a TFT substrate) through the portions of the adhesion layer to form the display device of this embodiment. In conventional methods, the entire adhesion layer is first attached onto the second substrate, and then the light-emitting units are bonded onto the second substrate through the adhesion layer. Compared with the conventional methods, the method for forming the display device of this embodiment has greater process flexibility and can be used to repair defective elements.

FIGS. 6A to 6E are a series of process cross-sectional views illustrating the method for forming the display device of this embodiment.

Figure 6A:
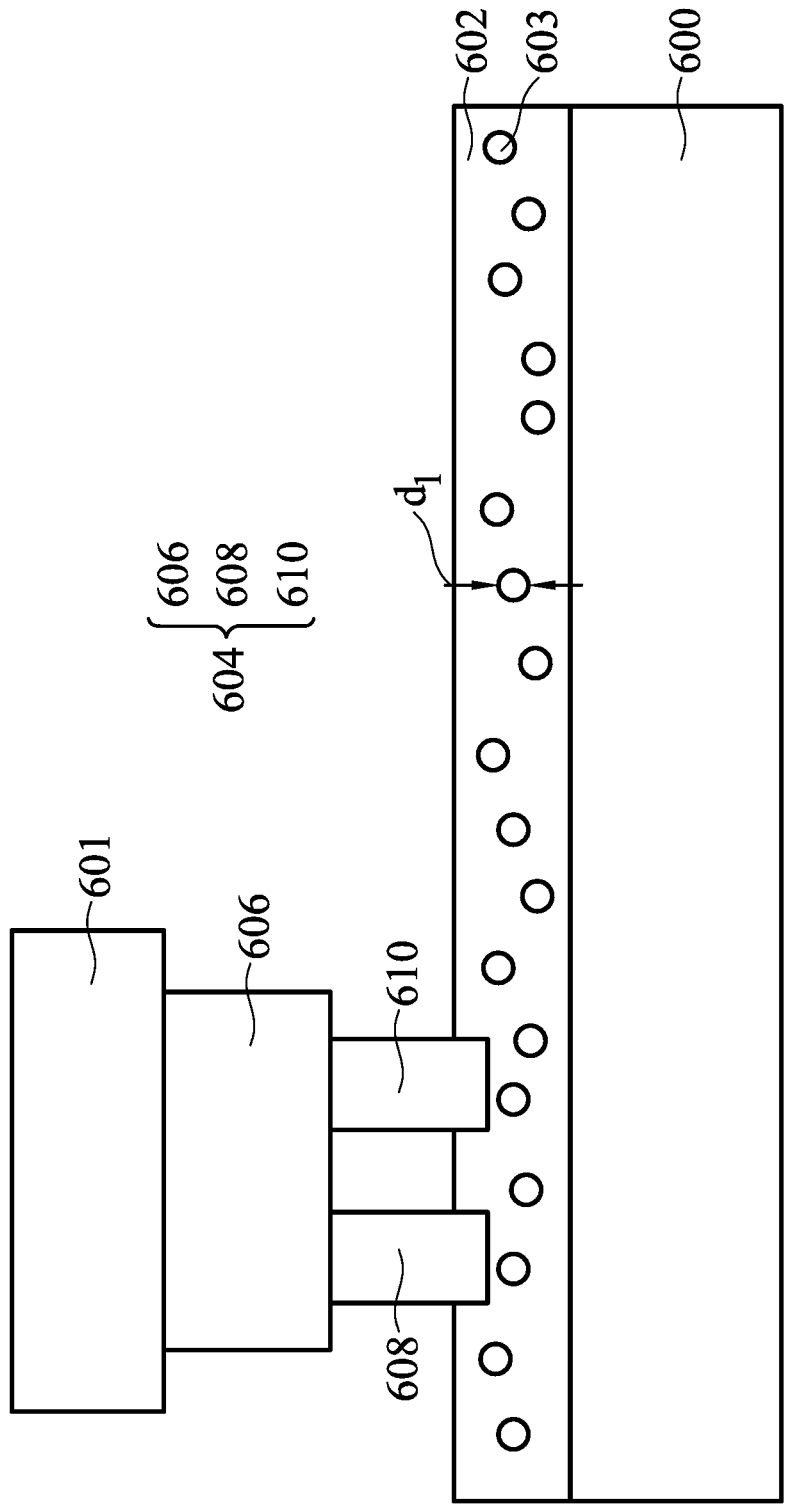
FIGS. 6A, 6B, 6C, 6D, and 6E are a series of cross-sectional views illustrating a method for forming the display device 60 according to some embodiments of the present disclosure.

First, as shown in FIG. 6A, an adhesion layer 602 is provided on the first substrate 600. In some embodiments, the adhesion layer 602 is used to bond the light-emitting units onto another substrate in a subsequent process.

In some embodiments, the adhesion layer 602 may comprise a conductive material such as anisotropic conductive film. For example, the adhesion layer 602 may include a plurality of conductive particles 603 substantially uniformly distributed therein. For example, each of the conductive particles 603 may be substantially round or oval from a cross-sectional view. For example, the diameter $d_1$ of each of the conductive particles 603 may be in a range between 0.1 μm and 10 μm.

In some embodiments, the conductive particles 603 may be spacers which can be used to control the distance between the light-emitting units and the substrate after the light-emitting units being bonded on the substrate. In some embodiments, the lengths (or the diameters) of the spacers are less than the thicknesses of the conductive layers (e.g., the conductive layer 608 and the conductive layer 610 which will be discussed in the following paragraphs) of the light-emitting units. For example, metals which can be used for eutectic bonding or low temperature welding may be plated on the surfaces of the spacers. The metals may include, for example, Sn, Ag, In, Cu, Au, Ni, Pd, Pt, alloys thereof, or a combination thereof, but the present disclosure is not limited thereto.

In some embodiments, the adhesion layer 602 may include an under-fill film.

Still referring to FIG. 6A, a light-emitting unit 604 is moved onto the first substrate 600, and the light-emitting unit 604 is partially inserted into the adhesion layer 602. In some embodiments, a pick head 601 may be used to grasp (or pick up) the light-emitting unit 604 and move the light-emitting unit 604 over the adhesion layer 602, and then the pick head 601 is lowered to stamp the light-emitting unit 604 onto the adhesion layer 602.

In this embodiment, before the light-emitting unit 604 is grasped by the pick head 601, the mother substrate (not shown in the figure) for the light-emitting unit 604 has been removed. However, the present disclosure is not limited thereto. In some other embodiments, when the light-emitting unit 604 is grasped by the pick head 601, the mother substrate (e.g., a sapphire substrate) has not been removed. Therefore, the mother substrate may be between the pick head 601 and the light-emitting unit 604, and the pick head 601 may control the movement of the light-emitting unit 604 by correspondingly grasping and moving the mother substrate. For example, the mother substrate may be removed by a laser lift-off process after bonding the light-emitting unit 604 onto the second substrate discussed in the following paragraphs.

As shown in FIG. 6A, the light-emitting unit 604 may include a light-emitting body 606, a conductive layer 608, and a conductive layer 610. In some embodiments, the conductive layer 608 and the conductive layer 610 may be similar to, or the same as the first conductive layer 108a and the third conductive layer 110a of the above embodiments. In some other embodiments, the conductive layer 608 and the conductive layer 610 may be similar to, or the same as the second conductive layer 108b and the fourth conductive layer 110b of the above embodiments. For example, the first conductive layer (or the second conductive layer) 608 and the third conductive layer (or the fourth conductive layer) 610 may be the electrodes of the light-emitting unit 604 and electrically connected with the substrate of the display device.

Figure 6B:
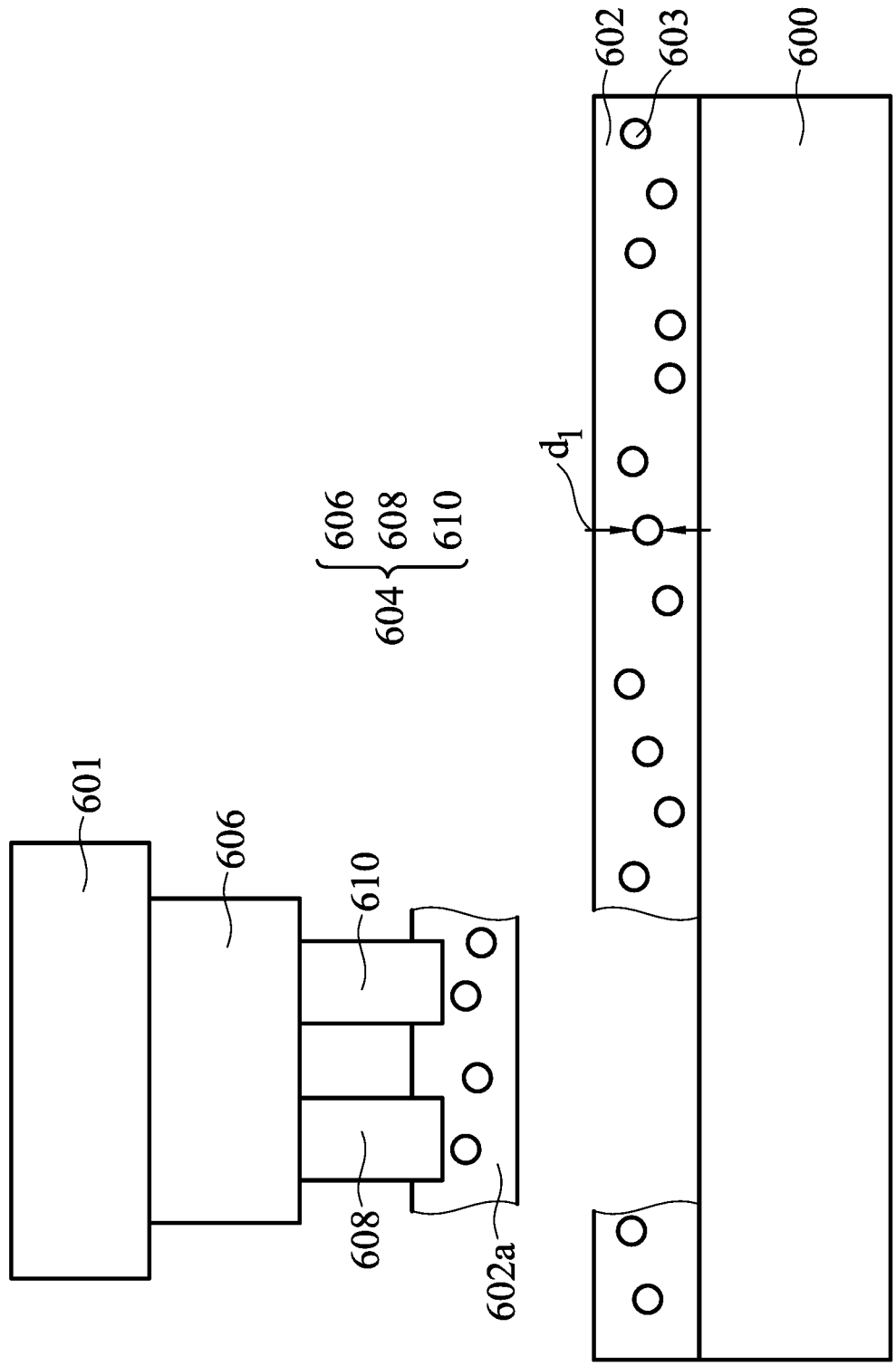

Then, as shown in FIG. 6B, the light-emitting unit 604 may be lifted upward by the pick head 601, such that a portion 602a of the adhesion layer 602 is attached onto the light-emitting unit 604 and separated from the first substrate 600. In detail, the portion 602a of the adhesion layer 602 separated from the first substrate 600 may be attached onto the first conductive layer (or the second conductive layer) 608 and the third conductive layer (or the fourth conductive layer) 610 of the light-emitting unit 604.

Figure 6C:
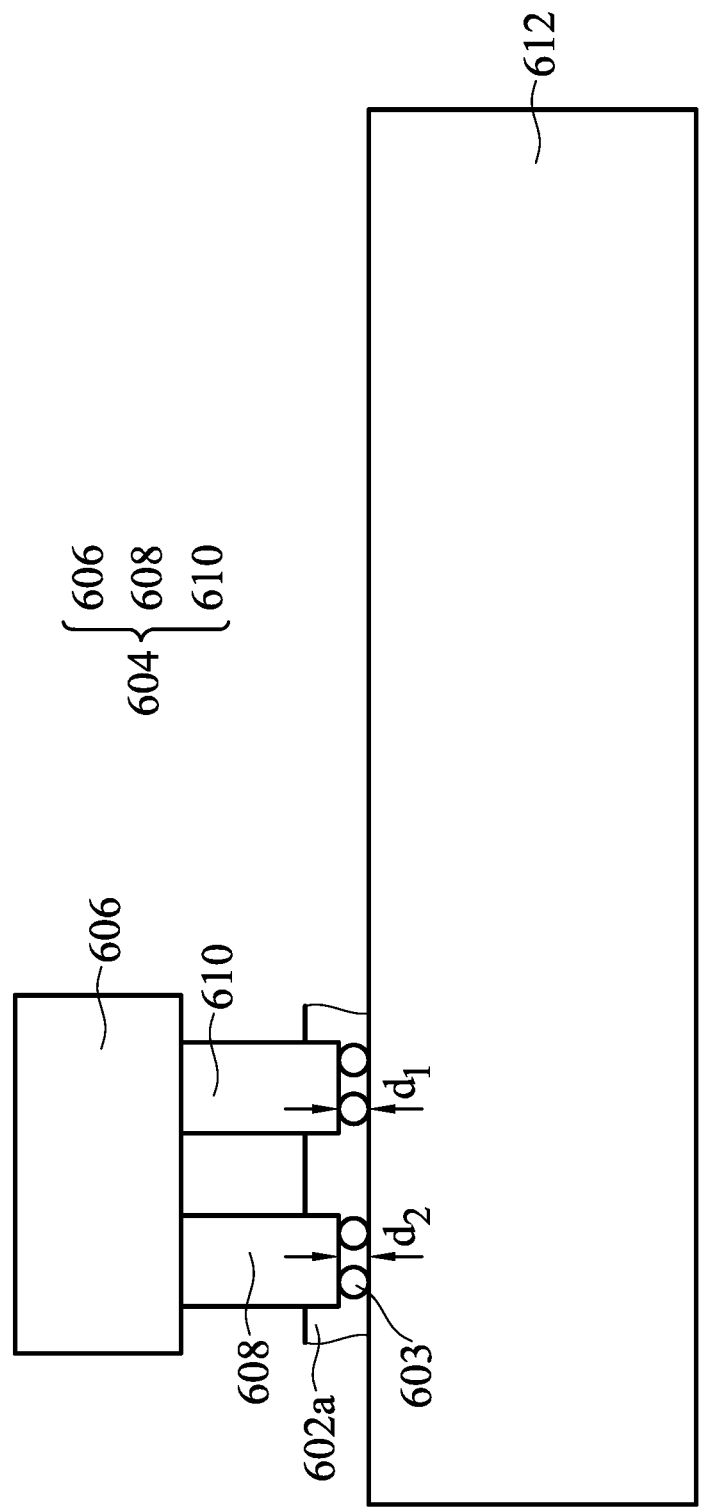

Then, as shown in FIG. 6C, in some embodiments, the light-emitting unit 604 and the portion 602a of the adhesion layer 602 are moved onto the second substrate 612 by the pick head 601, and the light-emitting unit 604 is bonded onto the second substrate 612 through the portion 602a of the adhesion layer 602, and the pick head 601 is removed from the light-emitting unit 604. In detail, in some embodiments, the first conductive layer (or the second conductive layer) 608 and the third conductive layer (or the fourth conductive layer) 610 of the light-emitting unit 604 may be bonded onto the bonding pads (not separately shown in the figure) of the second substrate 612 through the portion 602a of the adhesion layer 602. For example, the bonding pads may comprise conductive materials such as metals.

For example, the second substrate 612 may include one or more active elements (not shown in the figure) such as transistors. For example, the second substrate 612 may be a TFT substrate. In some embodiments, the one or more active elements may be electrically connected with the light-emitting unit 604 through the bonding pads of the second substrate 612, and the first conductive layer (or the second conductive layer) 608 and the third conductive layer (or the fourth conductive layer) 610. In some embodiments, the one or more active elements may control or adjust the driving signal (e.g., current signal) transmitted to the light-emitting unit 604, so as to adjust the brightness of the light-emitting unit 604.

In some embodiments, the step of bonding the light-emitting unit 604 onto the second substrate 612 may include applying an applicable pressure (e.g., in a range between 1 and 100 MPa) and/or temperature (e.g., in a range between 100 and 300° C.) to the portion 602a of the adhesion layer 602 to increase the adhesion force of the portion 602a of the adhesion layer 602, such that the portion 602a of the adhesion layer 602 can bond the light-emitting unit 604 and the second substrate 612.

In some embodiments, the step of bonding the light-emitting unit 604 onto the second substrate 612 may include a eutectic bonding process. The eutectic bonding process may require specific metals (e.g., including Sn alloy, or Ag—Au mixture), and the eutectic bonding may occur if the process temperature is raised to an applicable temperature. For example, an eutectic reaction between the conductive particles 603, and the first conductive layer (or the second conductive layer) 608 and the third conductive layer (or the fourth conductive layer) 610, and an eutectic reaction between the conductive particles 603, and the bonding pads of the second substrate 612 can occur in the eutectic bonding process, such that the light-emitting unit 604 can be bonded onto the second substrate 612.

As discussed above, in some embodiments, the conductive particles 603 may serve as the spacers which can be used to control the distance $d_2$ between the light-emitting unit 604 and the second substrate 612. In some embodiments of which the conductive particles 603 are spacers, the distance $d_2$ between the light-emitting unit 604 and the second substrate 612 is substantially equal to the diameter $d_1$ of any one of the conductive particles 603.

Figure 6D:
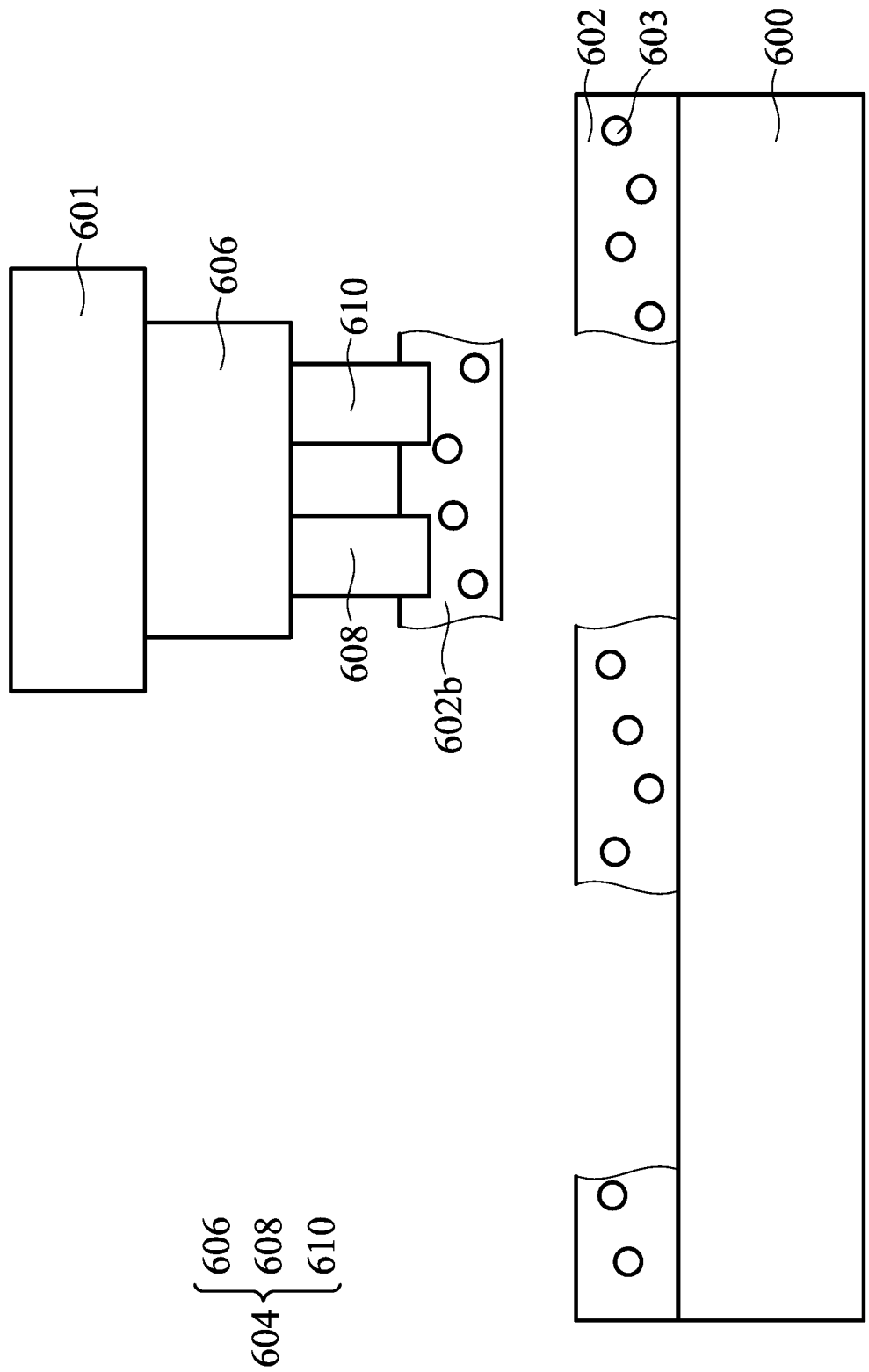
Figure 6E:
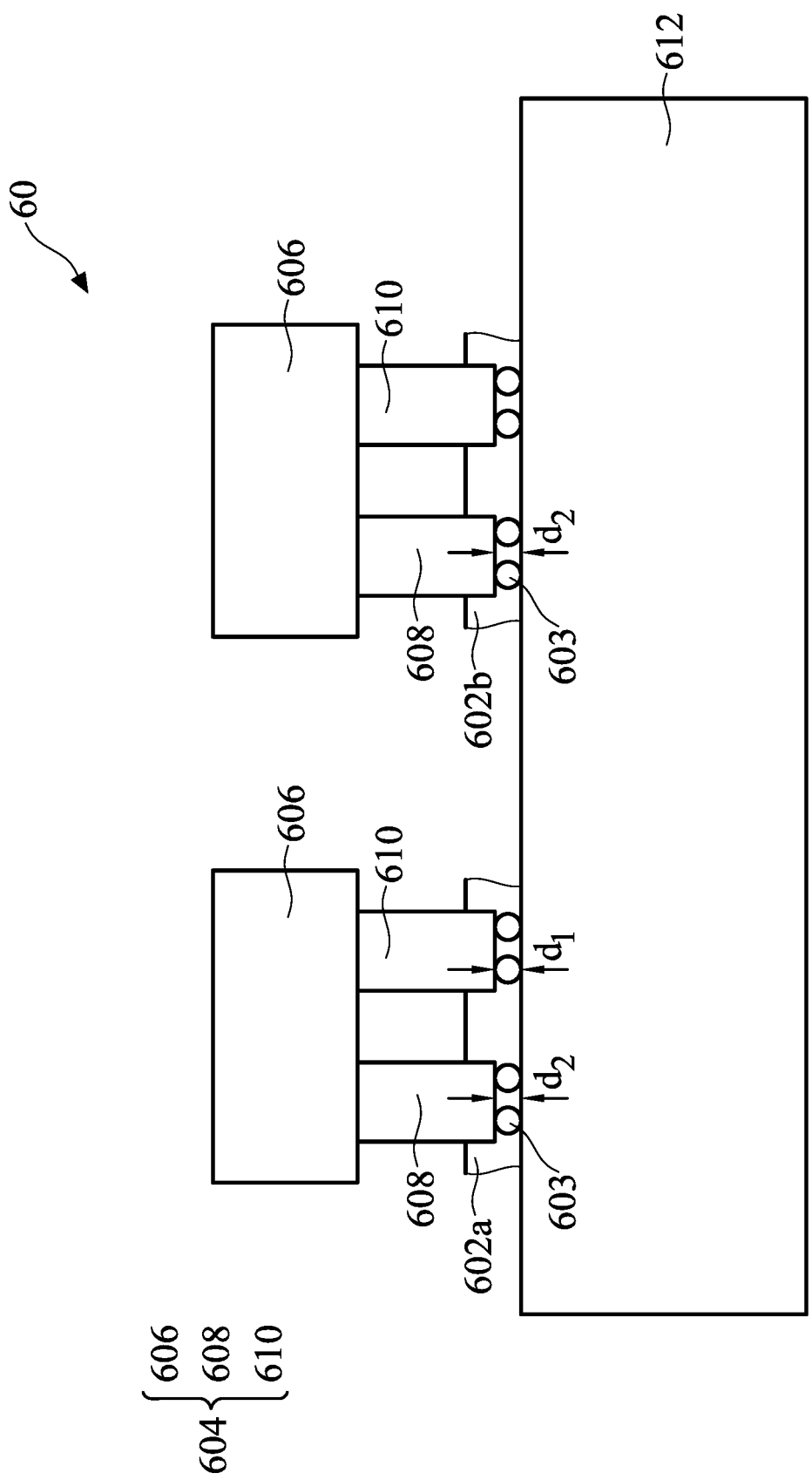

Then, as shown in FIG. 6D and FIG. 6E, by repeating the above steps, another light-emitting unit 604 may be bonded onto the second substrate 612 through a portion 602b of the adhesion layer 602 to form the display device 60 of the present disclosure. In some embodiments, the above steps may be repeated for many times to bond a plurality of light-emitting units 604 of different colors (e.g., red, blue, and green) onto the second substrate 612 through the adhesion layer 602.

In some embodiments, each light-emitting unit 604 has its own respective bonding step. In other words, in these embodiments, after each one of the light-emitting units 604 and the portion of the adhesion layer attached thereto are moved onto the corresponding bonding pads of the second substrate 612, a respective bonding step thereof is performed to bond it onto the second substrate 612. However, in some other embodiments, a plurality of light-emitting units 604 and the portions of the adhesion layer attached thereto may be moved onto the corresponding bonding pads of the second substrate 612, and then one bonding step (e.g., applying the applicable pressure and/or temperature discussed above, or performing a eutectic bonding process) may be performed to simultaneously bond the plurality of light-emitting units 604 onto the second substrate 612, thus reducing the process steps and the manufacturing time.

In some embodiments, after several light-emitting units 604 are bonded onto the second substrate 612, quality tests may be performed to test the quality of these light-emitting units 604. For example, if any one of these light-emitting units 604 is abnormal in quality, this abnormal light-emitting unit 604 and its corresponding portion of the adhesion layer 602 may be removed from the second substrate 612 (e.g., this abnormal light-emitting unit 604 and its corresponding portion of the adhesion layer 602 may be removed from the second substrate 612 by mechanical forces), and then the steps discussed with respect to FIG. 6A to FIG. 6C may be performed to bond another light-emitting unit 604 onto the second substrate 612 to replace this abnormal light-emitting unit 604. In other words, compared with conventional method in which the entire adhesion layer is attached onto the second substrate, the method of this embodiment can locally replace the light-emitting units which are abnormal in quality. Therefore, the flexibility of the manufacturing process may be improved, and the process steps and the manufacturing time may be reduced.

Some variation embodiments of this embodiment will be discussed in the following paragraphs. It should be noted that unless otherwise specified, in the variations of the embodiments, the elements the same as or similar to those discussed in the above embodiments will be denoted by the same reference numerals, and the forming methods thereof may also be the same as or similar to those discussed in the above embodiments.

Figure 6F:
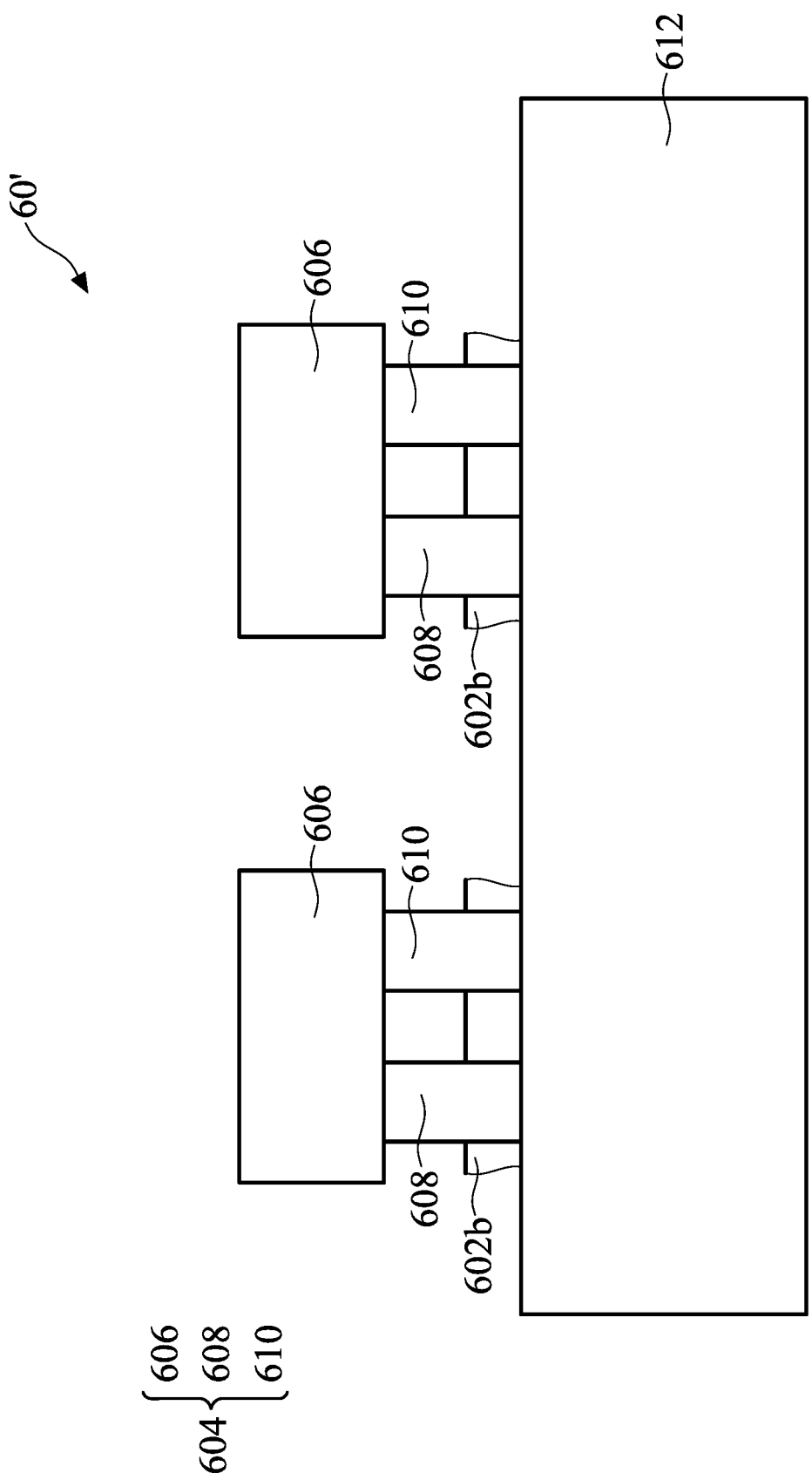
FIG. 6F illustrates a cross-sectional view of the display device 60' according to some embodiments of the present disclosure.

FIG. 6F illustrates the display device 60' of some embodiments of the present disclosure. One difference between the display device 60' and the display device 60 is that the adhesion layer 602 of the display device 60' is made of non-conductive materials. For example, the non-conductive materials may include polyimide, epoxy-containing resins, silicon, photoresist, other applicable materials, or a combination thereof. In some embodiments, since the adhesion layer 602 is not conductive, the first conductive layer (or the second conductive layer) 608 and the third conductive layer (or the fourth conductive layer) 610 of the light-emitting unit 604 are in direct contact with the bonding pads (not shown in the figure) of the second substrate 612 to electrically connect with the second substrate 612. In some embodiments, a eutectic reaction between the bonding pads of the second substrate 612, and the first conductive layer (or the second conductive layer) 608 and the third conductive layer (or the fourth conductive layer) 610 may be performed to increase the bonding forces therebetween.

In some embodiments, the adhesion layer 602 may include light curing materials and/or thermal curing materials. For example, the adhesion layer 602 which has not been cured may be provided on the first substrate 600, and then the steps the same as or similar to those discussed with respect to FIG. 6A to FIG. 6E may be performed to transfer the light-emitting units 604 and the corresponding portion 602a and/or portion 602b of the adhesion layer 602 to the second substrate 612, and then a light curing and/or a thermal curing process may be performed to cure the portion 602a and/or the portion 602b of the adhesion layer 602 to increase the adhesion force thereof, such that the portion 602a and/or the portion 602b of the adhesion layer 602 can bond the light-emitting units 604 and the second substrate 612.

Figure 6G:
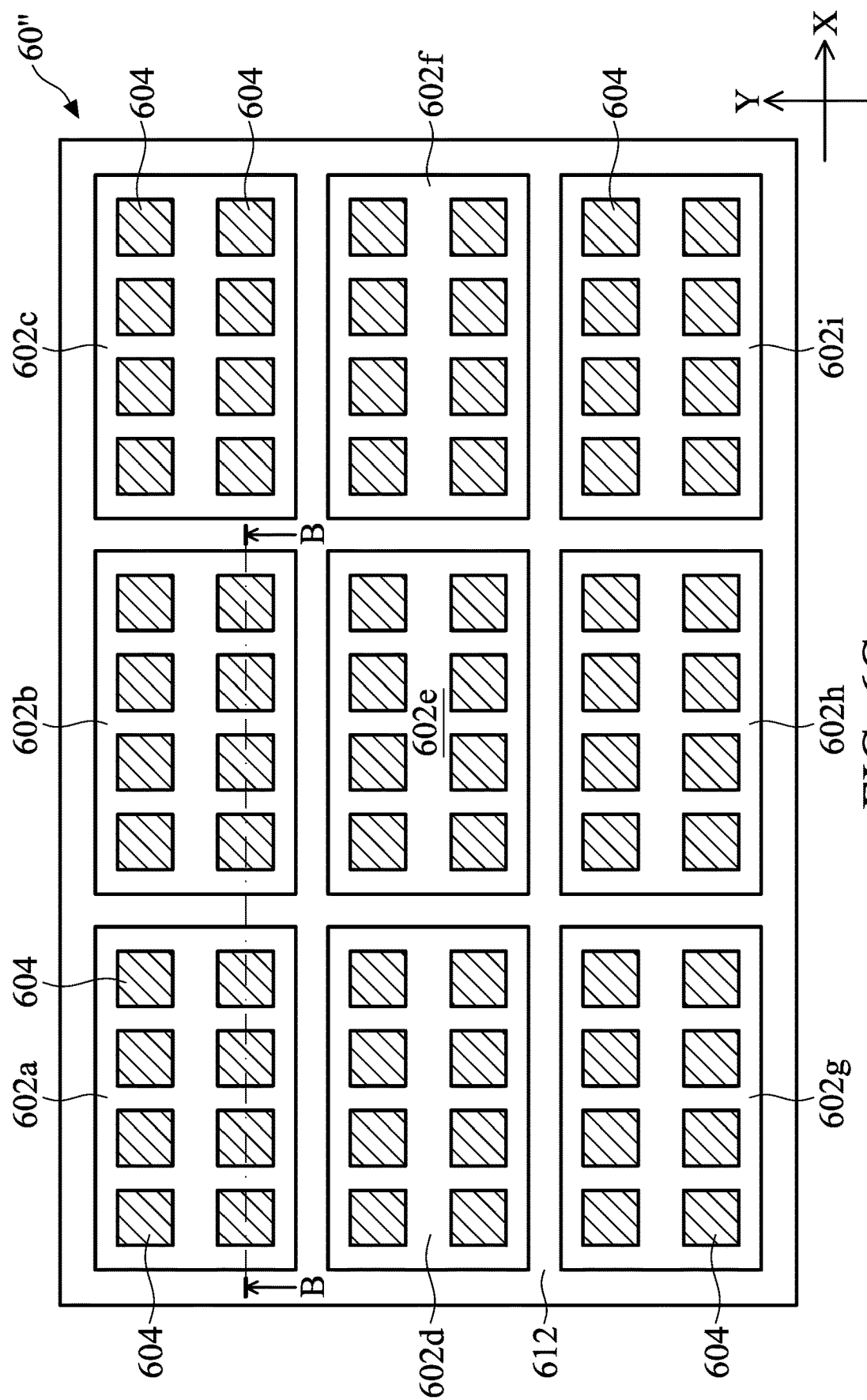
FIG. 6G and FIG. 6H respectively illustrate a top view and a cross-sectional view of the display device 60" according to some embodiments of the present disclosure.
Figure 6H:
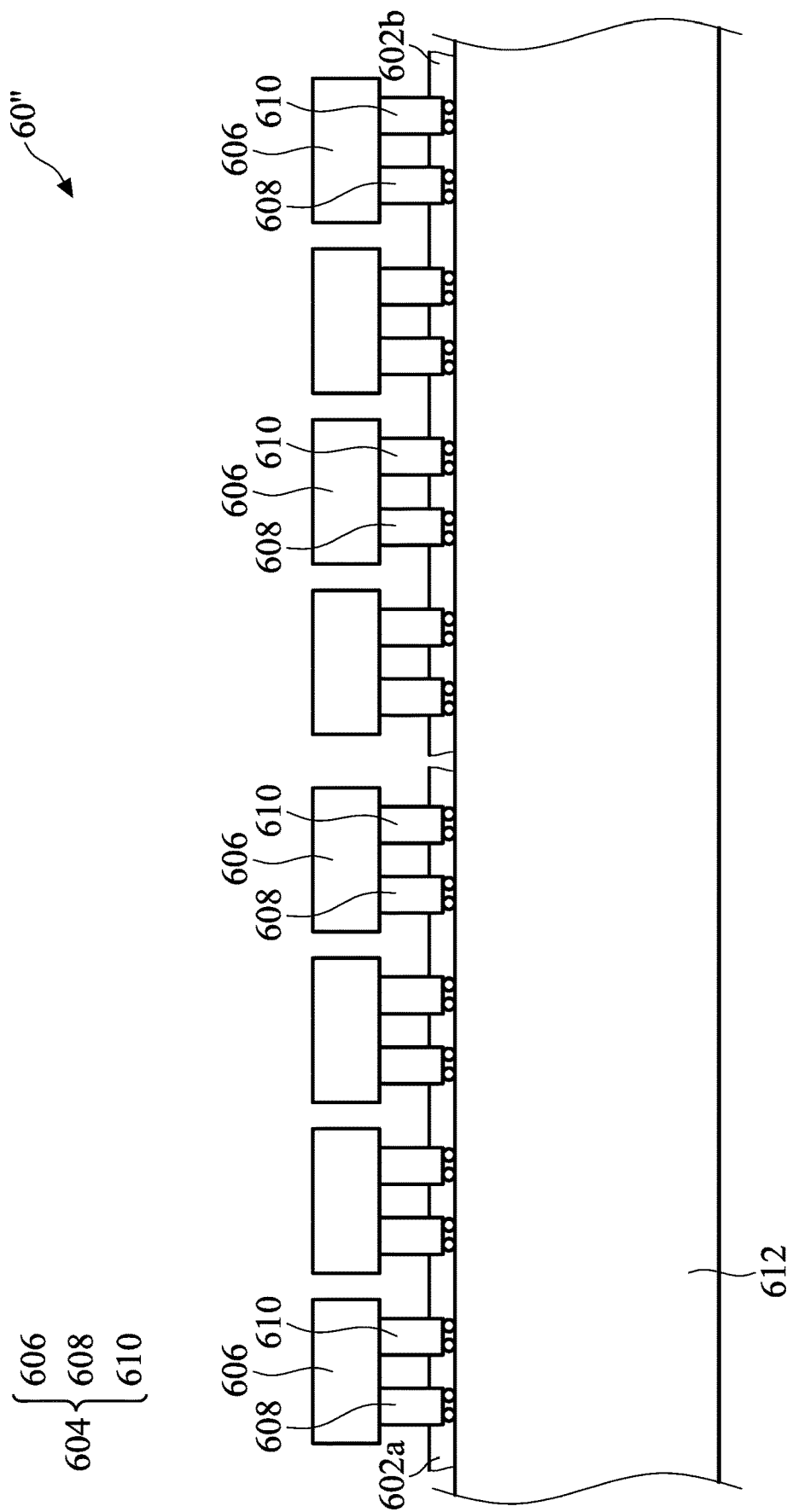

FIG. 6G and FIG. 6H respectively illustrate a partial top view and a cross-sectional view of the display device 60" of some embodiments of the present disclosure. In detail, FIG. 6H is a cross-sectional view taken along the cut line B-B of FIG. 6G. In these embodiments, the pick head 601 grasp a plurality of light-emitting units 604 simultaneously (e.g., three, six, eight, several hundred, more than several hundred, or another applicable number of light-emitting units), and then the light-emitting units 604 grasped by the pick head 601 are bonded onto the second substrate 612 through a portion of the adhesion layer 602 (e.g., any one of the portions 602a, 602b, 602c, 602d, 602e, 602f, 602g, 602h, and 602i illustrated in FIG. 6G), and the above steps may be repeated to use the pick head 601 to grasp another plurality of light-emitting units 604 simultaneously and bond them onto the second substrate 612 through another portion of the adhesion layer 602 (e.g., another one of the portions 602a, 602b, 602c, 602d, 602e, 602f, 602g, 602h, and 602i illustrated in FIG. 6G). In other words, in the embodiment illustrated in FIG. 6G, the steps of using the pick head 601 to grasp a plurality of light-emitting units 604 simultaneously and bonding them onto the second substrate 612 through a portion of the adhesion layer 602 (e.g., any one of the portions 602a, 602b, 602c, 602d, 602e, 602f, 602g, 602h, and 602i) are repeated. In some embodiments, as shown in FIG. 6G, any of the separate portions 602a to 602i of the adhesion layer 602 may correspond to eight light-emitting units 604, but the present disclosure is not limited thereto. It should be understood that any of the separate portions of the adhesion layer 602 (e.g., any of separate portions 602a to 602i) bonds its corresponding light-emitting units 604 onto the second substrate 612, and overlaps or partially overlaps its corresponding light-emitting units 604 in a top view. For example, as shown in FIG. 6G, any of the separate portions 602a to 602i of the adhesion layer 602 overlaps eight light-emitting units 604, and bonds these eight light-emitting units 604 onto the second substrate 612.

Figure 6I:
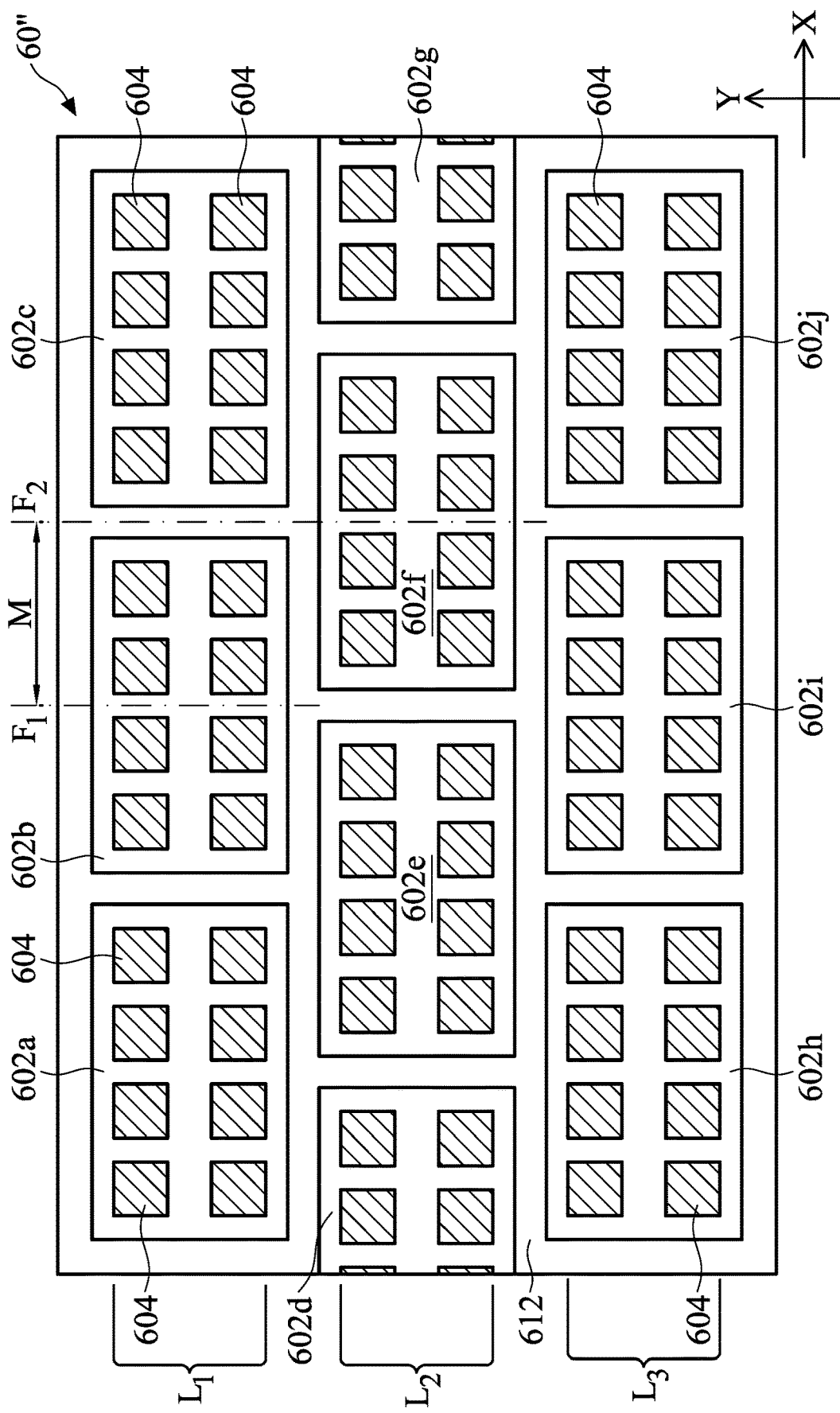
FIG. 6I illustrates a top view of the display device 60" according to some embodiments of the present disclosure.

As shown in FIG. 6G, in some embodiments, the plurality of portions of the adhesion layer 602 of the display device 60" are aligned with each other in the first direction Y and the second direction X (the second direction X may be substantially perpendicular to the first direction Y). However, the present disclosure is not limited thereto. In some other embodiments, the plurality of portions of the adhesion layer 602 may have a misalignment in at least one of the first direction Y and the second direction X. For example, in the embodiment illustrated in FIG. 6I, as viewed in the first direction Y, two adjacent rows of the adhesion layer 602 have a misalignment. In detail, in the embodiment illustrated in FIG. 6I, the first row $L_1$ (including the portions 602a, 602b, and 602c) and the second row $L_2$ (including the portions 602d, 602e, 602f, and 602g) of the adhesion layer 602 have a misalignment, and the second row $L_2$ and the third row $L_3$ (including the portions 602h, 602i, and 602j) of the adhesion layer 602 also have a misalignment. In some embodiments, the misalignment may be defined as the distance between two centerlines of two adjacent portions (the two adjacent portions may respectively be in two adjacent rows) of the adhesion layer 602. For example, the misalignment may be defined as the distance M between the centerline $F_1$ of the portion 602b of the first row $L_1$ and the centerline $F_2$ of the portion 602f of the second row $L_2$.

Some variation embodiments of this embodiment will be discussed in the following paragraphs. It should be noted that unless otherwise specified, in these various embodiments, the elements the same as or similar to those discussed in the above embodiments will be denoted by the same reference numerals, and the forming methods thereof may also be the same as or similar to those discussed in the above embodiments.

Figure 6J:
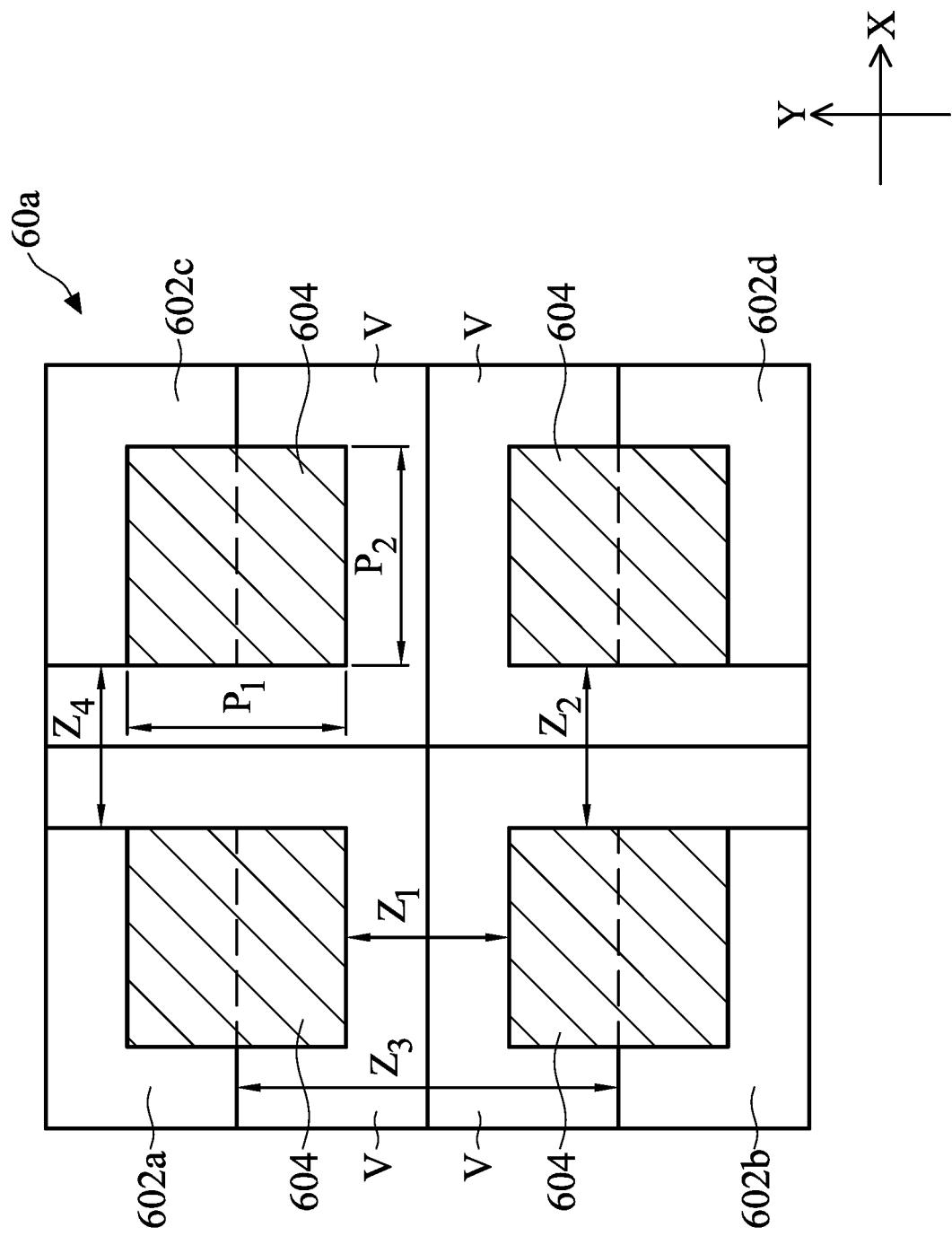
FIG. 6J illustrates a top view of the display device 60a according to some embodiments of the present disclosure.

FIG. 6J illustrates a partial top view of the display device 60a of some embodiments of the present disclosure. It should be understood that for simplicity and clarity, only several light-emitting units 604 and their corresponding portions of the adhesion layer 602 (e.g., portions 602a to 602d) of the display device 60a are illustrated in FIG. 6J. As shown in FIG. 6J, the adhesion layer 602 may include a plurality of portions (e.g., portions 602a to 602d) substantially adjacent to each other. For the sake of explanation, in the following paragraphs, the portion 602a, the portion 602b, the portion 602c, and the portion 602d may also respectively be referred to as the first adhesion layer 602a, the second adhesion layer 602b, the third adhesion layer 602c, and the fourth adhesion layer 602d.

In some embodiments, the display device 60a may have a plurality of pixels V. For example, in some embodiments, one pixel V may correspond to or include at least one light-emitting unit 604 (as shown in FIG. 6J), and correspond to or include the portion of the adhesion layer 602 corresponding to the at least one light-emitting unit 604, but the present disclosure is not limited thereto. It should be understood that although only four pixels V are illustrated in FIG. 6J, the present disclosure is not limited thereto. The display device 60a may have any other applicable number of pixels V, depending on design requirements.

As shown in FIG. 6J, one of the light-emitting units 604 has length $P_1$ (e.g., $P_1$ could be in a range between 1 and 100 µm) in the first direction Y and length $P_2$ (e.g., $P_2$ could be in a range between 1 and 100 µm) in the second direction X (the second direction X may be substantially perpendicular to the first direction Y). In some embodiments, the length $P_1$ may be less than the length $P_2$. However, the present disclosure is not limited thereto. In some other embodiments, the length $P_1$ may be greater than, or equal to the length $P_2$. As shown in FIG. 6J, two adjacent light-emitting units 604 have the spacing $Z_1$ in the first direction Y and the spacing $Z_2$ in the second direction X. In some embodiments, the spacing $Z_1$ could be in a range between 1 and 1000 µm, and the spacing $Z_2$ could be in a range between 1 and 1000 µm.

As shown in FIG. 6J, each of the plurality of adhesion layers (e.g., each of the first adhesion layer 602a, the second adhesion layer 602b, the third adhesion layer 602c, and the fourth adhesion layer 602d) of the display device 60a at least partially overlaps the corresponding light-emitting units 604 thereof. In detail, as shown in FIG. 6J, in some embodiments, each of the first adhesion layer 602a, the second adhesion layer 602b, the third adhesion layer 602c, and the fourth adhesion layer 602d partially overlaps one corresponding light-emitting unit 604. In some embodiments, as shown in FIG. 6J, adhesion layers which are adjacent to each other in the first direction Y (e.g., the first adhesion layer 602a and the second adhesion layer 602b) may have the spacing $Z_3$ there between, and adhesion layers which are adjacent to each other in the second direction X (e.g., the first adhesion layer 602a and the third adhesion layer 602c) may have the spacing $Z_4$ therebetween. In some embodiments which conform to the formula "$0<Z_3<(Z_1+P_1)$" and/or the formula "$0<Z_4<(Z_2+P_2)$", the problem of poor electrical connection between the light-emitting units 604 and the second substrate 612 resulting from insufficient adhesion force caused by the adhesive areas between the adhesion layers and the light-emitting units 604 being too small may be improved.

Figure 6K:
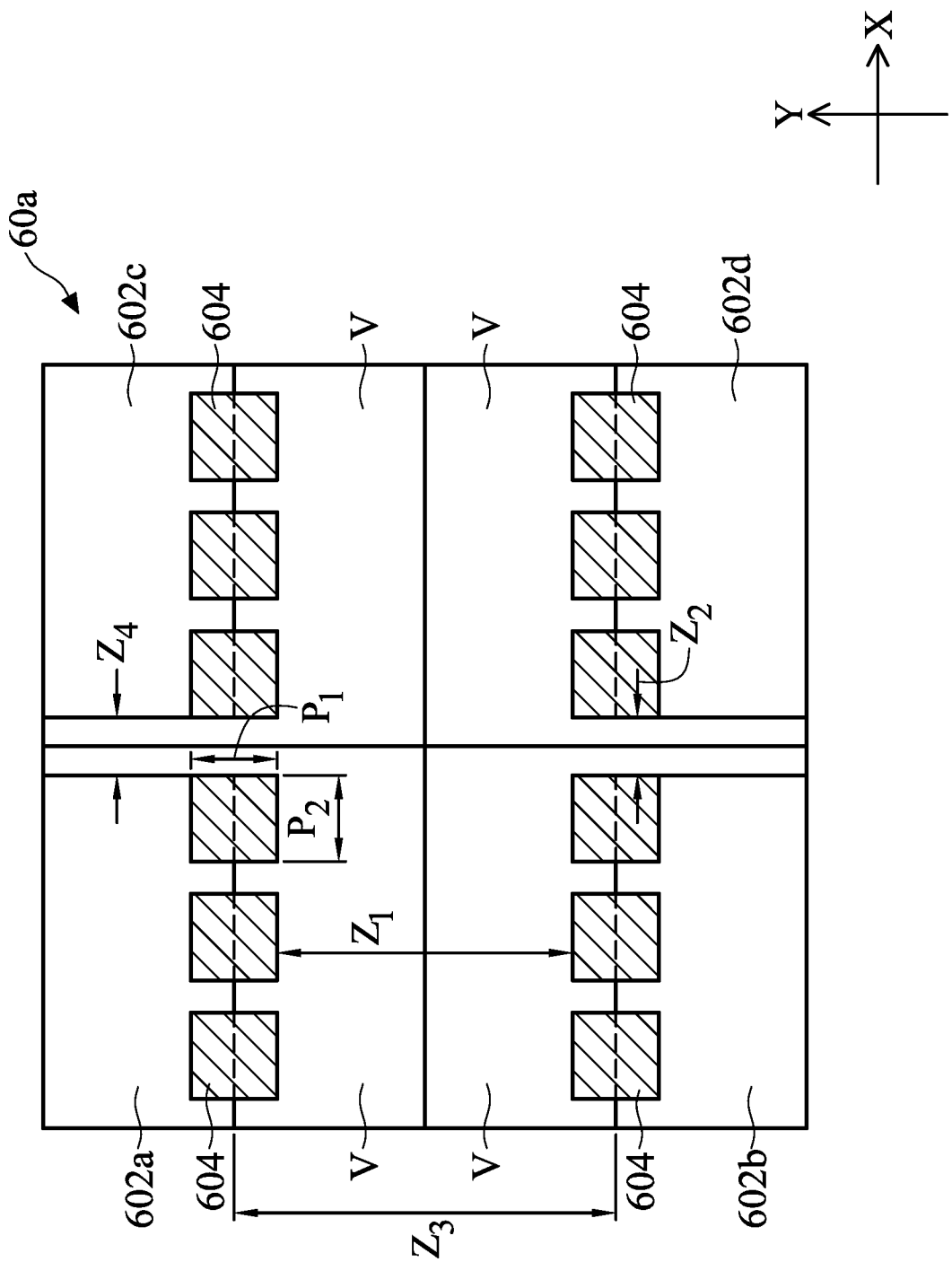
FIG. 6K illustrates a top view of the display device 60a according to some embodiments of the present disclosure.

In some embodiments, as shown in FIG. 6K, one pixel V may correspond to three light-emitting units 604 and the adhesion layers corresponding to these three light-emitting units 604. For example, the three light-emitting units 604 which correspond to one of the adhesion layers (e.g., the first adhesion layer 602a, the second adhesion layer 602b, the third adhesion layer 602c, or the fourth adhesion layer 602d) of the display device 60a may include a red light-emitting unit, a blue light-emitting unit, and a green light-emitting unit. However, the present disclosure is not limited thereto. In some other embodiments, the three light-emitting units 604 which correspond to one of the adhesion layers of the display device 60a may be the same color.

Similarly, some embodiments illustrated in FIG. 6K also conform to the formula "$0<Z_3<(Z_1+P_1)$" and/or the formula "$0<Z_4<(Z_2+P_2)$", and thus the problem of poor electrical connection between the light-emitting units 604 and the second substrate 612 resulting from insufficient adhesion force caused by the adhesive areas between the adhesion layers and the light-emitting units 604 being too small may be improved.

It should be understood that although in the embodiments illustrated in FIG. 6K, one pixel V corresponds to three light-emitting units 604, and three light-emitting units 604 corresponding to one of the adhesion layers (e.g., the first adhesion layer 602a, the second adhesion layer 602b, the third adhesion layer 602c, or the fourth adhesion layer 602d) of the display device 60a are arranged in a row (or a column), the present disclosure is not limited thereto. In some other embodiments, three light-emitting units 604 corresponding to one of the adhesion layers of the display device 60a may be arranged in a triangle (as shown in FIG. 6L and FIG. 6M).

Figure 6L:
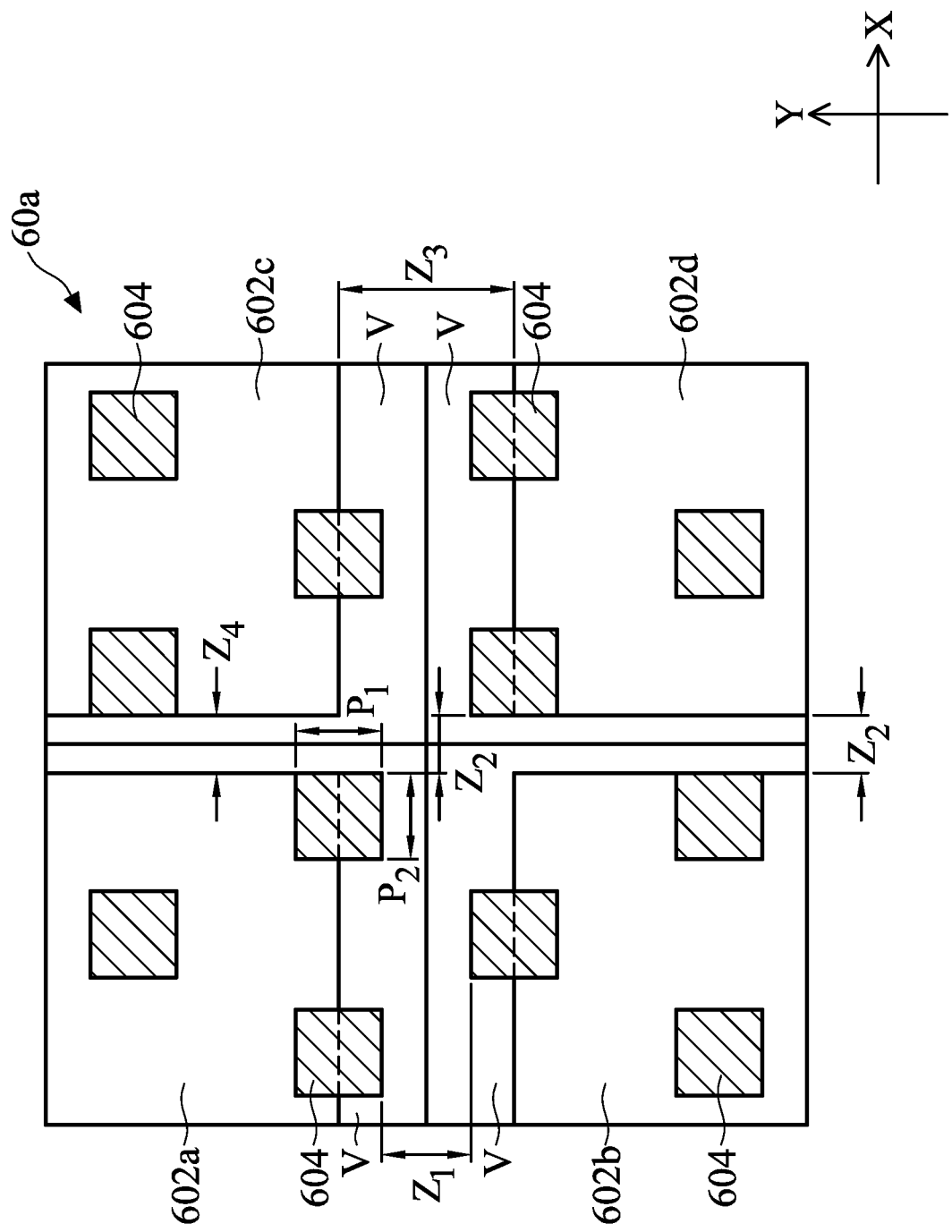
FIG. 6L illustrates a top view of the display device 60a according to some embodiments of the present disclosure.
Figure 6M:
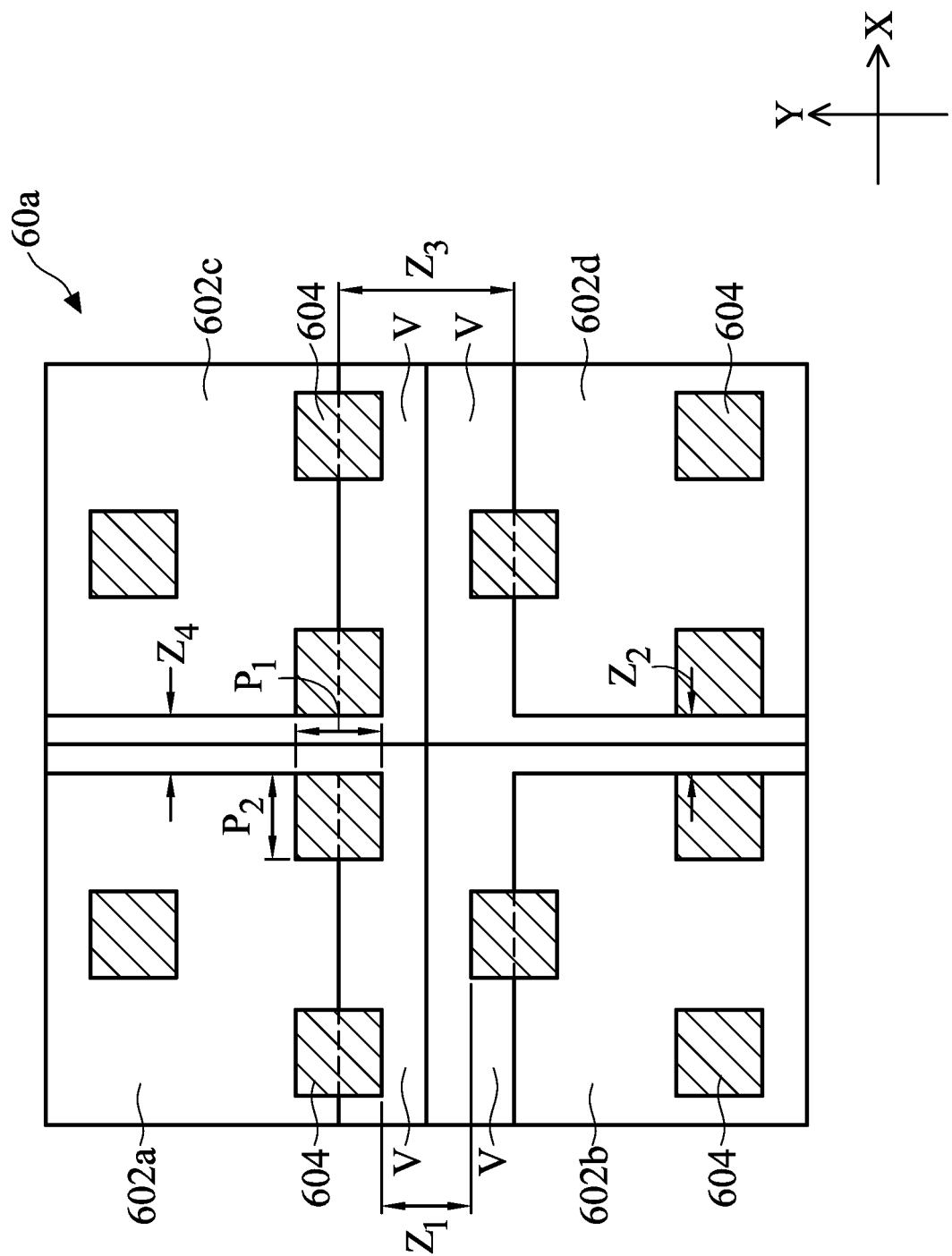
FIG. 6M illustrates a top view of the display device 60a according to some embodiments of the present disclosure.

Similarly, some embodiments illustrated in FIG. 6L and FIG. 6M also conform to the formula "$0<Z_3<(Z_1+P_1)$" and/or the formula "$0<Z_4<(Z_2+P_2)$", and thus the problem of poor electrical connection between the light-emitting units 604 and the second substrate 612 resulting from insufficient adhesion force caused by the adhesive areas between the adhesion layers and the light-emitting units 604 being too small may be improved.

Figure 6N:
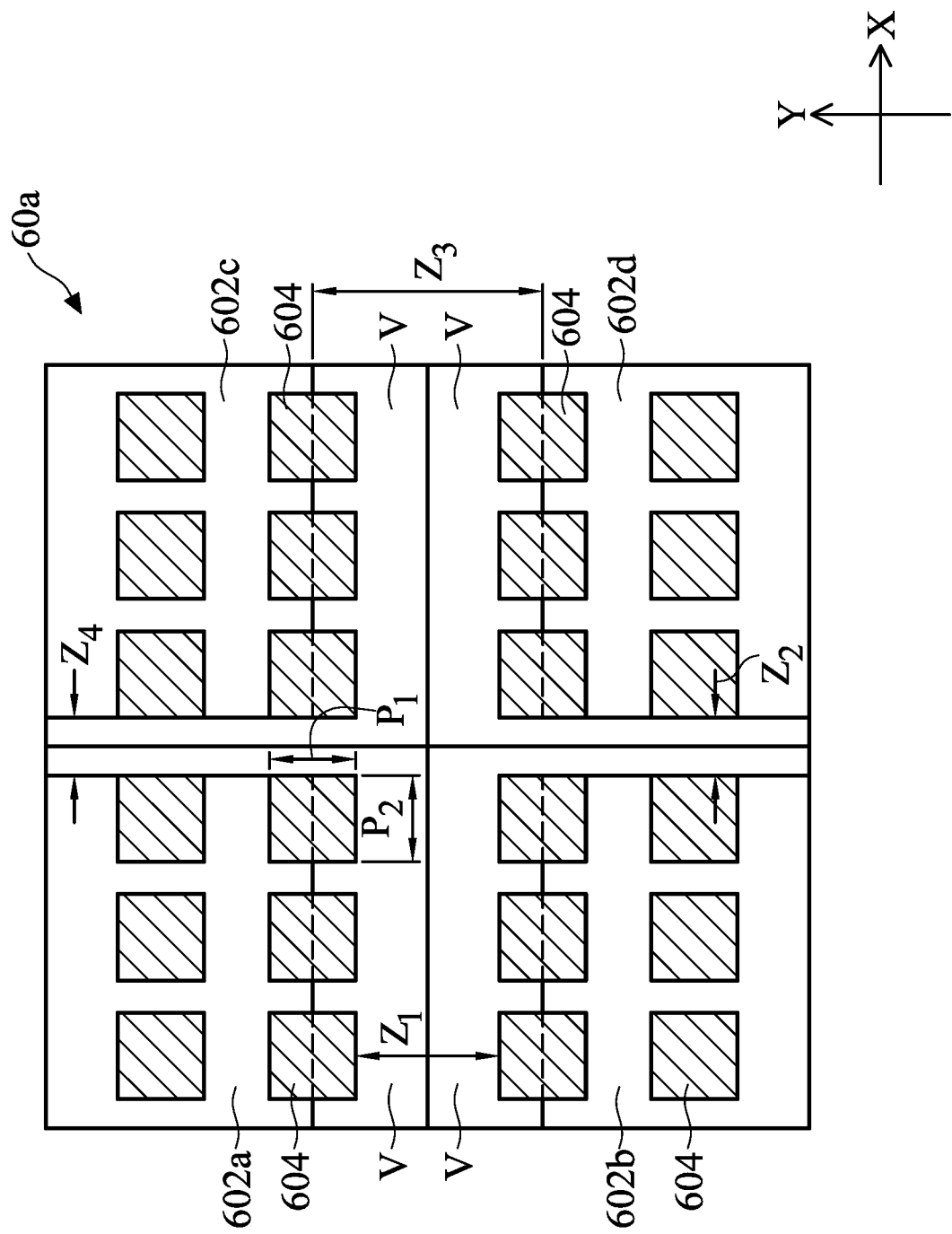
FIG. 6N illustrates a top view of the display device 60a according to some embodiments of the present disclosure.

In some other embodiments, one of the adhesion layers (e.g., the first adhesion layer 602a, the second adhesion layer 602b, the third adhesion layer 602c, or the fourth adhesion layer 602d) of the display device 60a may be disposed corresponding to six light-emitting units 604 (as shown in FIG. 6N). In these embodiments, six light-emitting units 604 corresponding to one of the adhesion layers of the display device 60a may be the same color or different colors.

Similarly, some embodiments illustrated in FIG. 6N also conform to the formula "$0<Z_3<(Z_1+P_1)$" and/or the formula "$0<Z_4<(Z_2+P_2)$", and thus the problem of poor electrical connection between the light-emitting units 604 and the second substrate 612 resulting from insufficient adhesion force caused by the adhesive areas between the adhesion layers and the light-emitting units 604 being too small may be improved.

It should be understood that in some other embodiments, one pixel V may correspond to any other applicable number of the light-emitting units 604, depending on design requirements.

The light-emitting units 604 of Embodiment 2 and the variation embodiments thereof may include the light-emitting units 103 discussed in the above embodiments. In other words, the method discussed in Embodiment 2 and the variation embodiments thereof may be used to bond the light-emitting units 103 onto a substrate such as a TFT substrate.

Embodiment 3

This embodiment provides a method for forming a display device by bonding light-emitting units (e.g., light-emitting diodes) onto a substrate (e.g., a TFT substrate). In the method, an adhesion layer is provided on a substrate such as a TFT substrate, and then the adhesion layer is patterned by a lithography process. Since the patterned adhesion layer is formed by the lithography process, the formed patterns may have smaller dimensions (or sizes) and thus can be applied to bond the light-emitting units having small dimensions (or sizes) and the substrate (e.g., a TFT substrate) of the display device.

FIG. 7A to FIG. 7D are a series of process cross-sectional views illustrating the method for forming the display device of this embodiment.

Figure 7B:
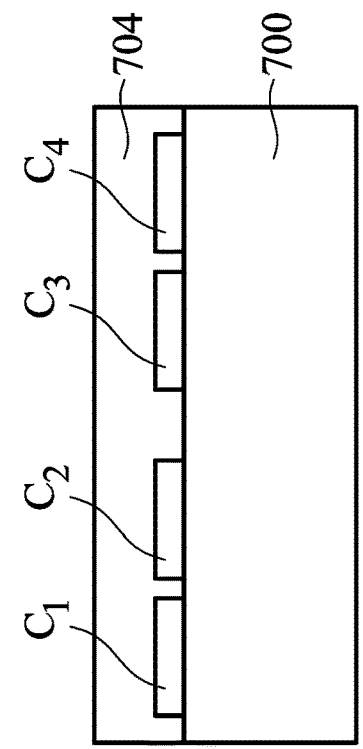
FIGS. 7A, 7B, 7C, and 7D are a series of cross-sectional views illustrating a method for forming the display device 70 according to some embodiments of the present disclosure.
Figure 7D:
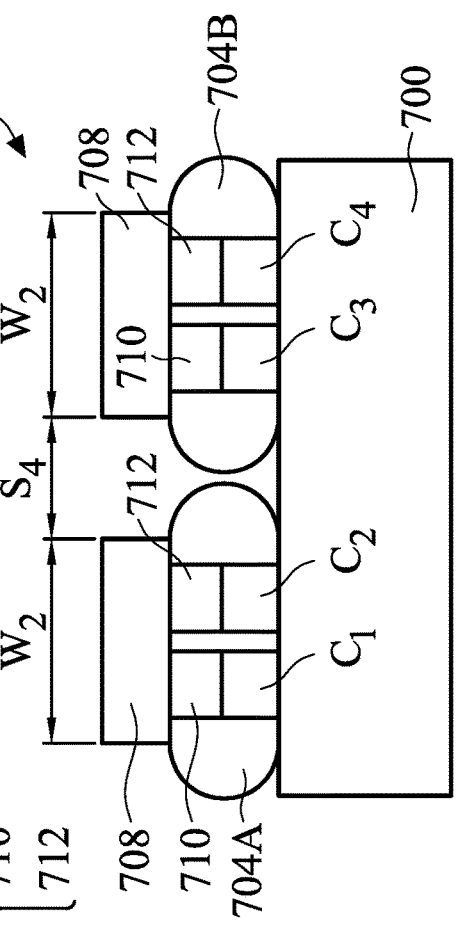
Figure 7A:
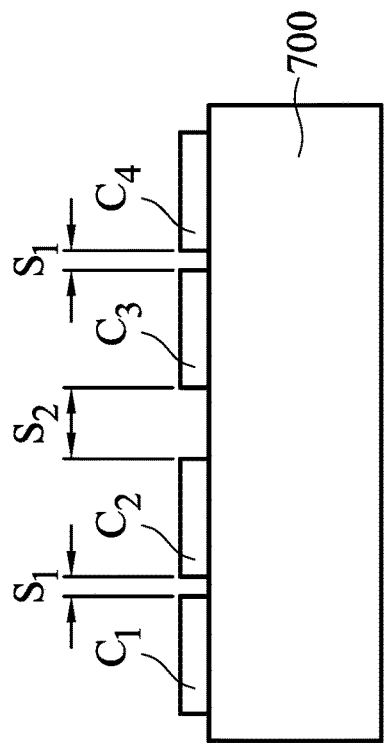

As shown in FIG. 7A, a substrate 700 is provided. In some embodiments, the substrate 700 may include one or more bonding pads disposed thereon. For example, in the embodiments illustrated in FIG. 7A, the substrate 700 includes four bonding pads $C_1$, $C_2$, $C_3$, and $C_4$. However, the present disclosure is not limited thereto. The substrate 700 may include any applicable number of the bonding pads, depending on design requirements (e.g., the number of light-emitting units to be bonded onto the substrate 700). In some embodiments, the bonding pads (e.g., $C_1$, $C_2$, $C_3$, and $C_4$) may comprise conductive materials such as metals.

In some embodiments, the bonding pads $C_1$ and $C_2$ adjacent to each other, and the bonding pads $C_3$ and $C_4$ adjacent to each other may respectively correspond to different light-emitting units. As shown in FIG. 7A, adjacent bonding pads corresponding to the same light-emitting unit may have the spacing $S_1$ (e.g., the spacing of the bonding pads $C_1$ and $C_2$, or the spacing of the bonding pads $C_3$ and $C_4$) therebetween. In some embodiments, the spacing $S_1$ is substantially equal to the spacing of the conductive layers (e.g., electrodes) of the light-emitting units to be bonded onto the substrate 700. For example, the spacing $S_1$ could be in a range between 2 and 200 μm.

In some embodiments, adjacent bonding pads corresponding to different light-emitting units may have the spacing $S_2$ (e.g., the spacing of the bonding pads $C_2$ and $C_3$) therebetween. For example, in a large display device, the spacing $S_2$ may be up to 50 mm. However, as the display devices are miniaturized, the spacing $S_2$ is also gradually reduced. In some embodiments, the spacing $S_2$ may be as small as 2 μm (e.g., the spacing $S_2$ could be in a range between 2 and 500 μm). It should be understood that the method discussed herein can be applied both to the small and large display devices.

Then, as shown in FIG. 7B, an adhesion layer 704 is formed on the substrate 700, and the adhesion layer 704 may cover the bonding pads $C_1$ and $C_2$, and $C_3$ and $C_4$. In some embodiments, the adhesion layer 704 is made of non-conductive materials. In some embodiments, the adhesion layer 704 may be a photoresist material which can be patterned by a lithography process. For example, the photoresist material may include, for example, acrylic, siloxane, or polyimide, but the present disclosure is not limited thereto. In some embodiments, the adhesion layer 704 may include light curing and/or thermal curing materials which have not been cured yet. For example, the adhesion layer 704 may be applied onto the substrate 700 using a slit nozzle.

In some embodiments, a soft baking process may be performed after the adhesion layer 704 is applied onto the substrate 700, so as to increase the adhesion of the adhesion layer 704 to the surface of the substrate 700.

Figure 7C:
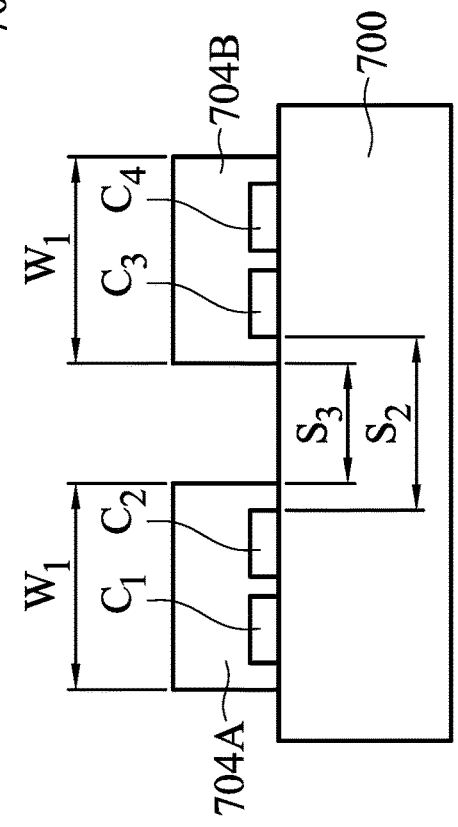

Then, as shown in FIG. 7C, the adhesion layer 704 is patterned to form the patterned adhesion layer 704. For example, the patterning steps may include exposure, post-exposure baking, developing, other applicable processes, or a combination thereof.

In some embodiments, after the patterning steps, the patterned adhesion layer 704 may have a plurality of separate patterns (e.g., a first pattern 704A and a second pattern 704B) corresponding to different light-emitting units. In some embodiments, as shown in FIG. 7C, the first pattern 704A corresponds to the light-emitting unit which the bonding pads $C_1$ and $C_2$ correspond to, and the second pattern 704B corresponds to the light-emitting unit which the bonding pads $C_3$ and $C_4$ correspond to.

As discussed above, as the display devices are miniaturized, the spacing $S_2$ is gradually reduced. Therefore, the spacing $S_3$ between the first pattern 704A and the second pattern 704B is also gradually reduced (e.g., the spacing $S_3$ may be reduced from 50 mm to 2 µm). Therefore, if the patterned adhesion layer 704 is formed using a conventional process such as screen printing process, the spacing $S_3$ will be too large to be good for the miniaturization of the display devices. By comparison, in the method of this embodiment, the patterned adhesion layer 704 is formed using a lithography process, and thus the spacing $S_3$ can be smaller (e.g., the spacing $S_3$ could be reduced to be about in a range between 2 and 200 µm).

In addition, as the dimensions or sizes (e.g., the widths) of the light-emitting units decrease, the widths $W_1$ of the first pattern 704A and the second pattern 704B corresponding to the light-emitting units need to be reduced correspondingly. Therefore, if the patterned adhesion layer 704 is formed using a conventional process such as screen printing process, the widths $W_1$ will be too large to be applicable for bonding small-sized light-emitting units. By comparison, in the method of this embodiment, the patterned adhesion layer 704 is formed using a lithography process, and thus the widths $W_1$ of the first pattern 704A and the second pattern 704B can be smaller. In some embodiments, the widths $W_1$ of the first pattern 704A and the second pattern 704B may be reduced to 8 µm (e.g., the widths $W_1$ could be about in a range between 8 and 240 µm).

In some embodiments, as shown in FIG. 7C, after the pattering steps, the patterned adhesion layer 704 still covers the bonding pads $C_1$, $C_2$, $C_3$, and $C_4$, so that the top surfaces of the bonding pads $C_1$, $C_2$, $C_3$, and $C_4$ are not exposed. Furthermore, in some embodiments, the first pattern 704A covers its corresponding bonding pads $C_1$ and $C_2$, and the second pattern 704B covers its corresponding bonding pads $C_3$ and $C_4$.

Then, as shown in FIG. 7D, the light-emitting units 706 are inserted into the first pattern 704A and the second pattern 704B of the adhesion layer 704.

In some embodiments, as shown in FIG. 7D, since the light-emitting units 706 are inserted into the first pattern 704A and the second pattern 704B of the patterned adhesion layer 704 before the patterned adhesion layer 704 is cured, the materials of the first pattern 704A and the second pattern 704B may be squeezed to flow outward by the light-emitting units 706. In some embodiments, as shown in FIG. 7D, the first pattern 704A and the second pattern 704B may have curved sidewall profiles after the light-emitting units 706 are inserted into the first pattern 704A and the second pattern 704B of the patterned adhesion layer 704.

Then, still referring to FIG. 7D, a curing process (e.g., a thermal curing process and/or a light curing process) may be performed to cure the patterned adhesion layer 704 to increase the adhesion force of the patterned adhesion layer 704, such that the patterned adhesion layer 704 can bond the light-emitting units 706 and the substrate 700 to form the display device 70 of the present disclosure. In some embodiments, since the cured patterned adhesion layer 704 can bond the light-emitting units 706 and the substrate 700, the first conductive layers (or the second conductive layers) 710 and the third conductive layers 712 (or the fourth conductive layers) of the light-emitting units 706 can be bonded onto the bonding pads $C_1$, $C_2$, $C_3$, and $C_4$ of the substrate 700 to form electrical connections between the substrate 700 and the light-emitting units 706 through the bonding pads $C_1$, $C_2$, $C_3$, and $C_4$ of the substrate 700 without performing an additional bonding process (e.g., performing an eutectic bonding process to cause an eutectic reaction between the first conductive layers (or the second conductive layers) 710 and the third conductive layers 712 (or the fourth conductive layers) of the light-emitting units 706, and the bonding pads $C_1$, $C_2$, $C_3$, and $C_4$ of the substrate 700).

As shown in FIG. 7D, adjacent light-emitting units 706 of the display device 70 may have the spacing $S_4$ therebetween. In some embodiments, since the patterned adhesion layer 704 is formed using a lithography process, the first pattern 704A and the second pattern 704B can have small spacing $S_2$, and thus adjacent light-emitting units 706 can also have small spacing $S_4$. Therefore, the number of the light-emitting units 706 per unit area can be increased, thus facilitating the miniaturization of the display device. For example, in some embodiments, the spacing $S_4$ may be reduced to about 2 µm (e.g., in a range between about 2 and 200 µm).

As discussed above, in some embodiments, since the patterned adhesion layer 704 is formed using a lithography process, the widths $W_1$ of the first pattern 704A and the second pattern 704B can be small (e.g., the widths $W_1$ may be in a range between 8 and to 240 µm). In other words, in these embodiments, the first pattern 704A and the second pattern 704B are applicable to bond small-sized light-emitting units 706 onto the substrate 700. For example, in some embodiments, the first pattern 704A and the second pattern 704B are applicable to bond the light-emitting units 706 of which the widths $W_2$ are in a range between 8 and 240 µm onto the substrate 700.

In some embodiments, as shown in FIG. 7D, the first pattern 704A and the second pattern 704B may fill or partially fill the gaps between the conductive layers 710 and 712 of the light-emitting units 706, and thus the fixing strengths of the light-emitting units 706 on the substrate 700 may be increased. In some embodiments, the first pattern 704A and the second pattern 704B may surround the conductive layers 710 and 712 of the light-emitting units 706, and the bonding pads $C_1$, $C_2$, $C_3$, and $C_4$ of the substrate 700, thus protecting the conductive layers 710 and 712 of the light-emitting units 706, and the bonding pads $C_1$, $C_2$, $C_3$, and $C_4$ of the substrate 700 from the damages caused by, for example, the moisture.

FIG. 8A to FIG. 8D illustrates some variation embodiments of the method for forming the display device of this embodiment. It should be noted that unless otherwise specified, in the various embodiments, the elements the same as or similar to those discussed in the above embodiments will be denoted by the same reference numerals, and the forming methods thereof may also be the same as or similar to those discussed in the above embodiments.

The steps illustrated in FIG. 8A, FIG. 8B, FIG. 8C, and FIG. 8D are respectively the same as or similar to those illustrated in FIG. 7A, FIG. 7B, FIG. 7C, and FIG. 7D. Therefore, only the differences therebetween will be discussed.

Figure 8A:
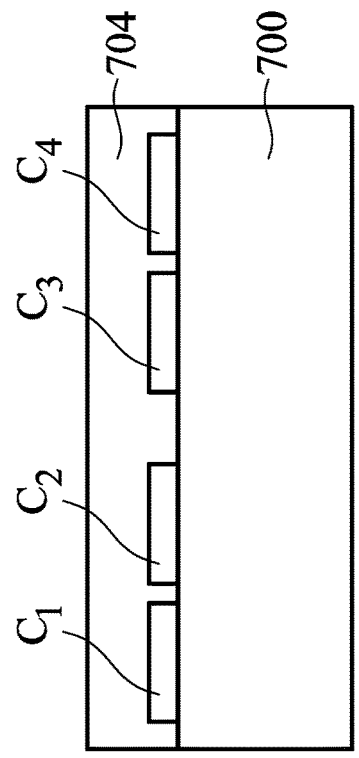
FIGS. 8A, 8B, 8C, and 8D are a series of cross-sectional views illustrating a method for forming the display device 80 according to some embodiments of the present disclosure.
Figure 8B:
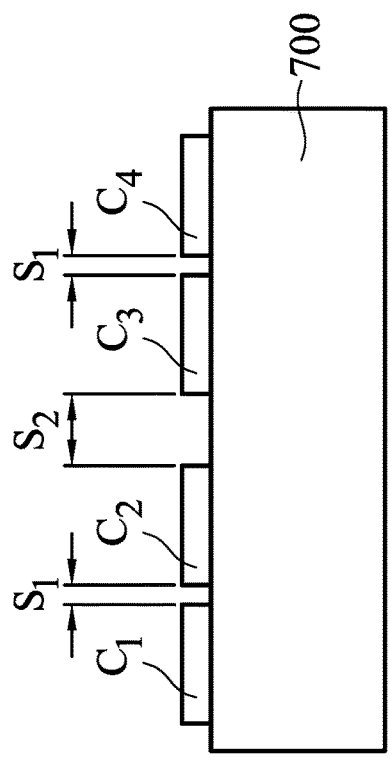
Figure 8C:
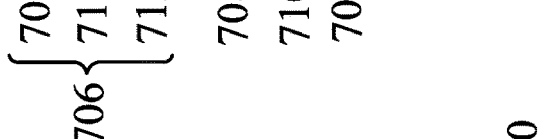

As shown in FIG. 8C, in some embodiments, the first pattern 704A and the second pattern 704B of the patterned adhesion layer 704 expose the top surfaces of the bonding pads $C_1$, $C_2$, $C_3$, and $C_4$. In detail, in some embodiments, the first pattern 704A includes openings $O_1$ and $O_2$ which expose the bonding pads $C_1$ and $C_2$, and the second pattern 704B includes openings $O_3$ and $O_4$ which expose the bonding pads $C_3$ and $C_4$.

Figure 8D:
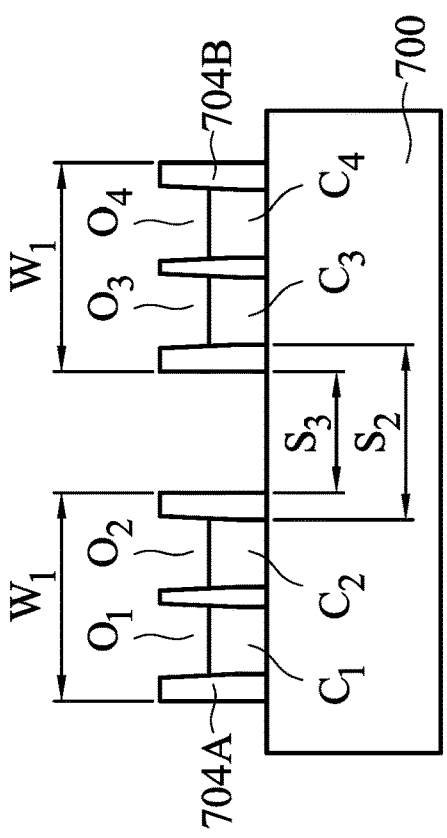

Then, as shown in FIG. 8D, the light-emitting units 706 are bonded onto the substrate 700 through the first pattern 704A and the second pattern 704B to form the display device 80 of the present disclosure. In some embodiments, as shown in FIG. 8D, since the first pattern 704A and the second pattern 704B include the openings $O_1$, $O_2$, $O_3$, and $O_4$, the outward flow of the materials of the first pattern 704A and the second pattern 704B caused by the squeeze of the light-emitting units 706 may be substantially reduced, such that the first pattern 704A and the second pattern 704B may have substantially straight sidewalls after the bonding process.

In some embodiments, since the first pattern 704A and the second pattern 704B include the openings $O_1$, $O_2$, $O_3$, and $O_4$, the problem of large amount of the materials of the first pattern 704A and the second pattern 704B spilling out when the light-emitting units 706 are bonded onto the substrate 700 may be improved.

In addition, the light-emitting units 706 of Embodiment 3 and the variation embodiments thereof may include the light-emitting units 103 discussed in the above embodiments. In other words, the method discussed in Embodiment 3 and the variation embodiments thereof may be used to bond the light-emitting units 103 onto a substrate such as a TFT substrate.

Embodiment 4

This embodiment provides a method for forming a display device by bonding light-emitting units (e.g., light-emitting diodes) onto a substrate (e.g., a TFT substrate). One difference between Embodiment 4 and Embodiment 3 is that the third adhesion layer used in Embodiment 4 includes conductive materials. In other words, the light-emitting units can be electrically connected with the substrate of the display device through the adhesion layer.

It should be noted that unless otherwise specified, in this embodiment, the elements the same as or similar to those discussed in the above embodiments will be denoted by the same reference numerals, and the forming methods thereof may also be the same as or similar to those discussed in the above embodiments.

The steps illustrated in FIG. 9A, FIG. 9B, FIG. 9C, and FIG. 9D are respectively the same as or similar to those illustrated in FIG. 7A, FIG. 7B, FIG. 7C, and FIG. 7D. Therefore, only the differences therebetween will be discussed.

Figure 9A:
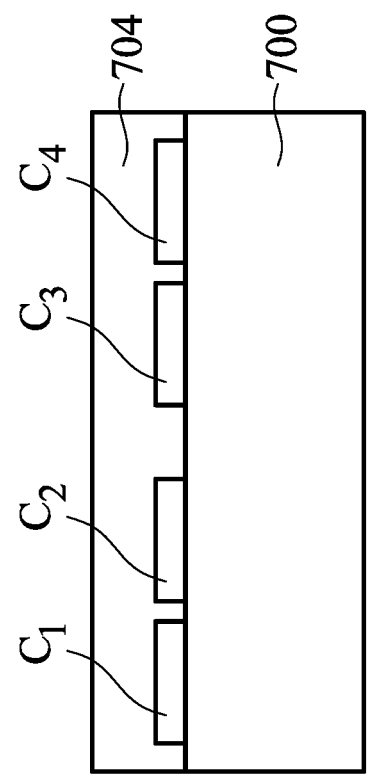
FIGS. 9A, 9B, 9C, and 9D are a series of cross-sectional views illustrating a method for forming the display device 90 according to some embodiments of the present disclosure.
Figure 9B:
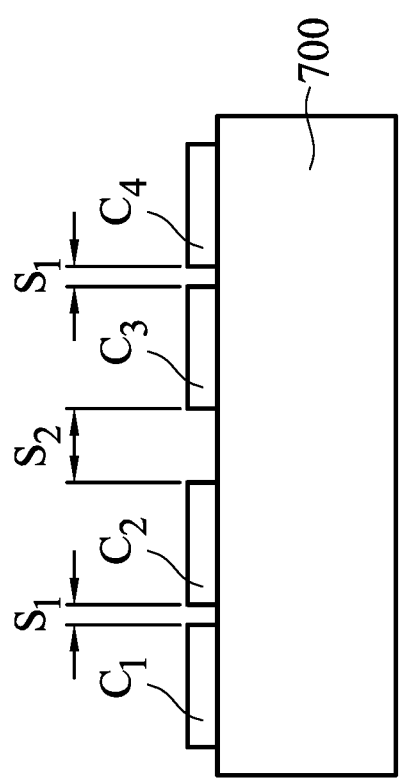

As shown in FIG. 9B, in some embodiments, the adhesion layer 704 may comprise a photoresist material (e.g., acrylic, siloxane, or polyimide) and conductive materials added into the photoresist material. In some embodiments, the adhesion layer 704 may include light curing and/or thermal curing materials which have not been cured yet. For example, the conductive material may be conductive carbon molecules (e.g., graphite, graphene, and carbon nanotubes), particles of metals (e.g., Cu, W, Ag, Sn, Ni, Cr, Ti, Pb, Au, Bi, Sb, Zn, Zr, Mg, In, Te, and Ga) or alloys thereof, particles of conducive metal oxides (e.g., ITO, SnO, IZO, IGZO, ITZO, ATO, and AZO), or other applicable conductive materials, but the present disclosure is not limited thereto.

Figure 9C:
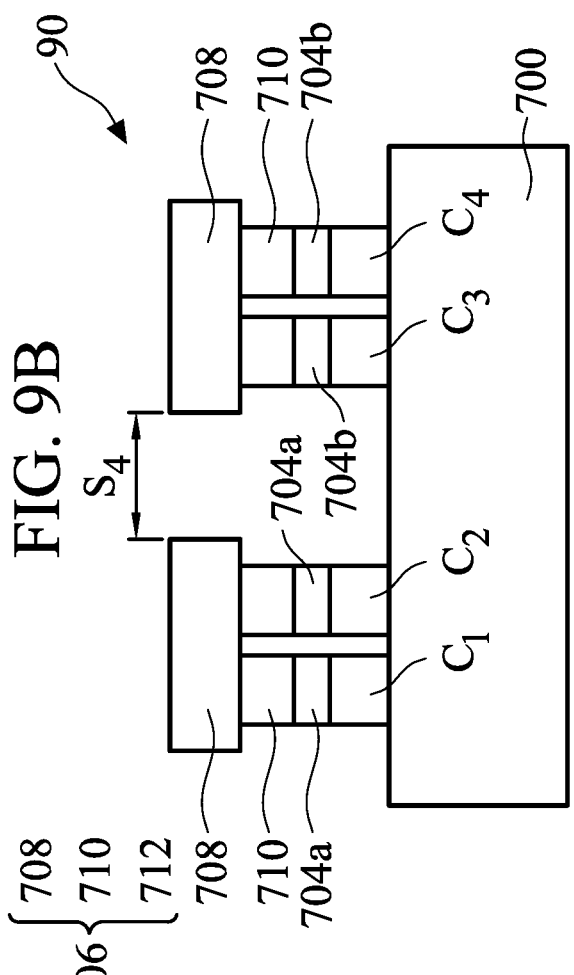

Then, as shown in FIG. 9C, the adhesion layer 704 is patterned. In some embodiments, the patterned adhesion layer 704 may include a first pattern 704A and a second pattern 704B, the first pattern 704A may include two sub-patterns 704a, and the second pattern 704B may include two sub-patterns 704b. In some embodiments, the two sub-patterns 704a of the first pattern 704A are separated from each other (the two sub-patterns 704b of the second pattern 704B are also separated from each other), thus reducing the occurrence of the short circuit between the first conductive layers (or the second conductive layers) 710 and the third conductive layers (or the fourth conductive layers) 712 of the light-emitting units 706 bonded onto the substrate 700 by the first pattern 704A and the second pattern 704B.

Figure 9D:
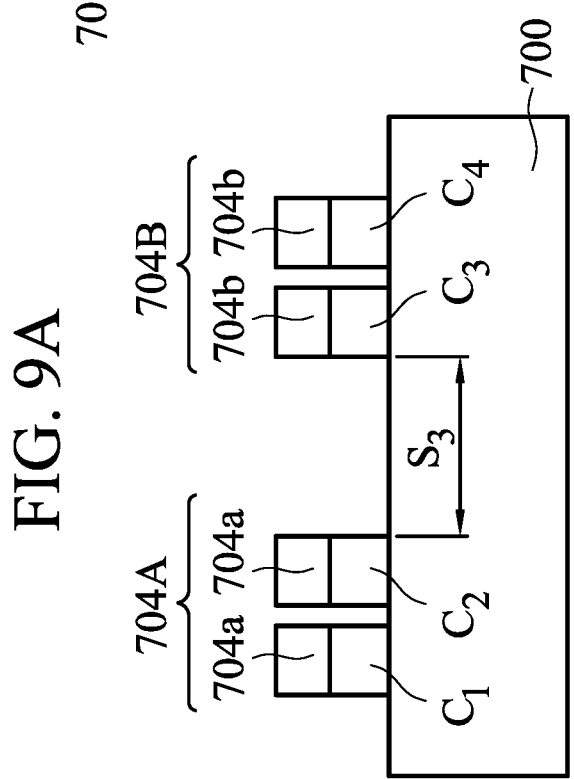

Then, as shown in FIG. 9D, the light-emitting units 706 are disposed on the patterned adhesion layer 704, and a curing process (e.g., a light curing process and/or a thermal curing process) is performed to cure the patterned adhesion layer 704 to increase the adhesion force of the patterned adhesion layer 704, such that the light-emitting units 706 can be bonded onto the substrate 700 through the first pattern 704A and the second pattern 704B to form the display device 90 of the present disclosure. In detail, in some embodiments, the two sub-patterns 704a of the first pattern 704A are respectively connected with the first conductive layer (or the second conductive layer) 710 and the third conductive layer (or the fourth conductive layer) 712 of one of the light-emitting units 706, and the two sub-patterns 704b of the second pattern 704B are respectively connected with the first conductive layer (or the second conductive layer) 710 and the third conductive layer (or the fourth conductive layer) 712 of another one of the light-emitting units 706.

In some embodiments, since the patterned adhesion layer 704 is conductive, the first conductive layers (or the second conductive layers) 710 and the third conductive layers (or the fourth conductive layers) 712 can be electrically connected with the bonding pads $C_1$, $C_2$, $C_3$, and $C_4$ of the substrate 700 through the patterned adhesion layer 704. In other words, in these embodiments, the first conductive layers (or the second conductive layers) 710 and the third conductive layers (or the fourth conductive layers) 712 do not have to be in direct contact with the bonding pads $C_1$, $C_2$, $C_3$, and $C_4$.

In addition, the light-emitting units 706 of Embodiment 4 may include the light-emitting units 103 discussed in the above embodiments. In other words, the method discussed in Embodiment 4 may be used to bond the light-emitting units 103 onto a substrate such as a TFT substrate.

It should be understood that the method of this embodiment can be applied to light-emitting units of various dimensions or sizes (e.g., light-emitting diodes of various dimensions or sizes). In some embodiments, the light-emitting units are light-emitting diodes, and the chip dimensions of the light-emitting diodes are in a range between about 300 μm and 10 mm, but the present disclosure is not limited thereto. In some embodiments, the light-emitting units are mini light-emitting diodes, and the chip dimensions of the mini light-emitting diodes are in a range between about 100 and 300 μm, but the present disclosure is not limited thereto. In some embodiments, the light-emitting units are micro light-emitting diodes, and the chip dimensions of the micro light-emitting diodes are in a range between about 1 and 100 μm, but the present disclosure is not limited thereto.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
   a substrate; and
   a light-emitting unit disposed on the substrate; wherein the light-emitting unit comprises:

a first conductive layer overlapping a second conductive layer;

a first semiconductor layer disposed between the first conductive layer and the second conductive layer;

a second semiconductor layer disposed between the first semiconductor layer and the first conductive layer;

a quantum well structure disposed between the first semiconductor layer and the second semiconductor layer;

a via hole penetrated through the first semiconductor layer and the quantum well structure;

a conductive material disposed in the via hole, wherein the second conductive layer is electrically connected with the second semiconductor layer through the conductive material; and a third conductive layer disposed adjacent to the first conductive layer, wherein the third conductive layer and the first conductive layer are disposed on a first side of the first semiconductor layer.

2. The display device as claimed in claim 1, further comprising:

an adhesion layer disposed between the substrate and the light-emitting unit, wherein the adhesion layer is partially disposed in a gap between the first conductive layer and the third conductive layer.

3. The display device as claimed in claim 1, wherein the light-emitting unit further comprises:

a second insulating layer disposed between the first semiconductor layer and the second conductive layer, wherein the via hole penetrates through the second insulating layer.

4. The display device as claimed in claim 1, further comprising:

a driving circuit disposed on the substrate, wherein the light-emitting unit is disposed on the driving circuit, and the light-emitting unit is electrically connected with the driving circuit.

5. The display device as claimed in claim 1, wherein the conductive material includes an acid-resistant metal.

6. The display device as claimed in claim 1, wherein the conductive material is in direct contact with the second semiconductor layer.

7. The display device as claimed in claim 1, wherein the conductive material is in direct contact with the second conductive layer.

8. The display device as claimed in claim 1, wherein at least one of the first conductive layer and the second conductive layer comprises a transparent conductive material.

9. The display device as claimed in claim 1, wherein the light emitting unit further comprises:

a fourth conductive layer disposed adjacent to the second conductive layer, the fourth conductive layer and the second conductive layer are disposed on a second side of the first semiconductor layer, wherein the first side is opposite to the second side.

10. The display device as claimed in claim 9, further comprising:

an adhesion layer disposed between the substrate and the light-emitting unit, wherein the adhesion layer is partially disposed in a gap between the second conductive layer and the fourth conductive layer.

11. The display device as claimed in claim 1, further comprising:

a first insulating layer disposed between the conductive material and a sidewall of the via hole.

12. The display device as claimed in claim 11, wherein the first insulating layer is disposed between the conductive material and the first semiconductor layer, and the first insulating layer is disposed between the conductive material and the quantum well structure.

13. A method for forming a display device, comprising:

providing a substrate, wherein a plurality of bonding pads are disposed on the substrate;

forming an adhesion layer on the substrate to cover the plurality of bonding pads;

patterning the adhesion layer to form a patterned adhesion layer corresponding to the plurality of bonding pads; and bonding a light-emitting unit to at least one of the bonding pads through the patterned adhesion layer.

14. The method as claimed in claim 13, wherein the step for bonding the light-emitting unit to at least one of the bonding pads comprises:

performing a curing process to cure the patterned adhesion layer.

15. The method as claimed in claim 13, wherein the light-emitting unit comprises:

a first conductive layer overlapping a second conductive layer;

a first semiconductor layer disposed between the first conductive layer and the second conductive layer;

a second semiconductor layer disposed between the first semiconductor layer and the first conductive layer;

a quantum well structure disposed between the first semiconductor layer and the second semiconductor layer;

a via hole penetrated through the first semiconductor layer and the quantum well structure; and a conductive material disposed in the via hole, wherein the second conductive layer is electrically connected with the second semiconductor layer through the conductive material.

16. A display device, comprising:

a substrate;

a first light-emitting unit and a second light-emitting unit disposed on the substrate, the first light-emitting unit being adjacent to the second light-emitting unit, wherein in a first direction, the first light-emitting unit has a length $P_1$, and the first light-emitting unit and the second light-emitting unit have a spacing $Z_1$;

a first adhesion layer disposed between the substrate and the first light-emitting unit;

a second adhesion layer disposed between the substrate and the second light-emitting unit, wherein in the first direction, the first adhesion layer and the second adhesion layer have a spacing $Z_3$, wherein the spacing $Z_1$, the spacing $Z_3$, and the length $P_1$ is conformed to the following formula:

$0 < Z_3 < (Z_1 + P_1)$, and each of $Z_1$, $Z_3$, and $P_1$ is greater than zero micrometer.

17. The display device as claimed in claim 16, wherein the first light-emitting unit comprises:

a first conductive layer overlapping a second conductive layer;

a first semiconductor layer disposed between the first conductive layer and the second conductive layer;

a second semiconductor layer disposed between the first semiconductor layer and the first conductive layer;

a quantum well structure disposed between the first semiconductor layer and the second semiconductor layer;

a via hole penetrated through the first semiconductor layer and the quantum well structure; and a conductive material disposed in the via hole, wherein the second conductive layer is electrically connected with the second semiconductor layer through the conductive material.

18. The display device as claimed in claim 16, further comprising:
a pixel, wherein the first light-emitting unit and the first adhesion layer are disposed corresponding to the pixel.

19. The display device as claimed in claim 18, further comprising:
a third light-emitting unit and a fourth light-emitting unit, wherein the third light-emitting unit and the fourth light-emitting unit are disposed corresponding to the pixel.

* * * * *